US009882353B2

(12) United States Patent
Hsu et al.

(10) Patent No.: US 9,882,353 B2
(45) Date of Patent: *Jan. 30, 2018

(54) GALLIUM AND NITROGEN CONTAINING LASER DEVICE HAVING CONFINEMENT REGION

(71) Applicant: Soraa Laser Diode, Inc., Goleta, CA (US)

(72) Inventors: Po Shan Hsu, Goleta, CA (US);
Melvin McLaurin, Goleta, CA (US);
James W. Raring, Goleta, CA (US);
Alexander Sztein, Goleta, CA (US);
Benyamin Buller, Goleta, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/356,302

(22) Filed: Nov. 18, 2016

(65) Prior Publication Data

US 2017/0077677 A1    Mar. 16, 2017

Related U.S. Application Data

(62) Division of application No. 14/480,398, filed on Sep. 8, 2014, now Pat. No. 9,520,695.
(Continued)

(51) Int. Cl.
*H01L 21/00*    (2006.01)
*H01S 5/343*    (2006.01)
(Continued)

(52) U.S. Cl.
CPC ........ *H01S 5/34333* (2013.01); *H01S 5/0202* (2013.01); *H01S 5/0215* (2013.01);
(Continued)

(58) Field of Classification Search
USPC ................ 438/33, 68, 113, 460, 91, 237, 27
See application file for complete search history.

(56) References Cited

U.S. PATENT DOCUMENTS

| 4,341,592 A | 7/1982 | Shortes et al. |
| 4,860,687 A | 8/1989 | Frijlink |

(Continued)

FOREIGN PATENT DOCUMENTS

| CN | 104836117 | 8/2015 |
| CN | 104836118 | 8/2015 |

(Continued)

OTHER PUBLICATIONS

U.S. Appl. No. 14/968,710 Notice of Allowance dated Mar. 3, 2017, 17 pages.
(Continued)

*Primary Examiner* — TImor Karimy
(74) *Attorney, Agent, or Firm* — Kilpatrick Townsend & Stockton

(57) ABSTRACT

A method for fabricating a laser diode device includes providing a gallium and nitrogen containing substrate member having a surface region, forming a patterned dielectric material overlying the surface region to expose a portion of the surface region within a vicinity of an recessed region of the patterned dielectric material and maintaining an upper portion of the patterned dielectric material overlying covered portions of the surface region, and performing a lateral epitaxial growth overlying the exposed portion of the surface region to fill the recessed region and causing a thickness of the lateral epitaxial growth to be formed overlying the upper portion of the patterned dielectric material. The method also includes forming an n-type gallium and nitrogen containing material, forming an active region, and forming a p-type gallium and nitrogen containing material.

(Continued)

Double ITO Clad, n-ridge

The method further includes forming a waveguide structure in the p-type gallium and nitrogen containing material.

3 Claims, 32 Drawing Sheets

Related U.S. Application Data

(60) Provisional application No. 61/892,981, filed on Oct. 18, 2013.

(51) Int. Cl.
*H01S 5/02* (2006.01)
*H01S 5/042* (2006.01)
*H01S 5/22* (2006.01)

(52) U.S. Cl.
CPC .......... *H01S 5/0217* (2013.01); *H01S 5/0425* (2013.01); *H01S 5/22* (2013.01); *H01S 2304/00* (2013.01)

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,474,021 A | 12/1995 | Tsuno et al. |
| 5,527,417 A | 6/1996 | Iida et al. |
| 5,562,127 A | 10/1996 | Fanselow et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 5,985,687 A | 11/1999 | Bowers et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,562,127 B1 | 5/2003 | Kud et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,143,148 B1 | 3/2012 | Raring et al. |
| 8,247,887 B1 | 8/2012 | Raring et al. |
| 8,252,662 B1 | 8/2012 | Poblenz et al. |
| 8,259,769 B1 | 9/2012 | Raring et al. |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 9,246,311 B1 | 1/2016 | Raring et al. |
| 9,362,715 B2 | 6/2016 | Sztein et al. |
| 9,368,939 B2 | 6/2016 | McLaurin et al. |
| 9,379,525 B2 | 6/2016 | McLaurin et al. |
| 9,520,695 B2 | 12/2016 | Hsu et al. |
| 9,520,697 B2 | 12/2016 | Steigerwald et al. |
| 9,653,642 B1 | 5/2017 | Raring |
| 9,666,677 B1 | 5/2017 | Raring et al. |
| 9,711,949 B1 | 7/2017 | Raring |
| 9,755,398 B2 | 9/2017 | Sztein et al. |
| 9,774,170 B2 | 9/2017 | McLaurin et al. |
| 2002/0050488 A1 | 5/2002 | Nikitin et al. |
| 2002/0085603 A1 | 7/2002 | Okumura |
| 2002/0097962 A1 | 7/2002 | Yoshimura et al. |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0209402 A1 | 10/2004 | Chai et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0118799 A1 | 6/2006 | D'evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |

(56) References Cited

U.S. PATENT DOCUMENTS

| | | |
|---|---|---|
| 2007/0081857 A1 | 4/2007 | Yoon |
| 2007/0086916 A1 | 4/2007 | Leboeuf et al. |
| 2007/0093073 A1 | 4/2007 | Farrell et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0267238 A1 | 10/2008 | Takeuchi et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0173957 A1 | 7/2009 | Brunner et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0291518 A1 | 11/2009 | Kim et al. |
| 2009/0298265 A1 | 12/2009 | Fujiwara |
| 2009/0301387 A1 | 12/2009 | D'evelyn |
| 2009/0301388 A1 | 12/2009 | D'evelyn |
| 2009/0309110 A1 | 12/2009 | Raring et al. |
| 2009/0309127 A1 | 12/2009 | Raring et al. |
| 2009/0320744 A1 | 12/2009 | D'evelyn |
| 2009/0321778 A1 | 12/2009 | Chen et al. |
| 2010/0001300 A1 | 1/2010 | Raring et al. |
| 2010/0003492 A1 | 1/2010 | D'evelyn |
| 2010/0006873 A1 | 1/2010 | Raring et al. |
| 2010/0008391 A1 | 1/2010 | Nakagawa et al. |
| 2010/0025656 A1 | 2/2010 | Raring et al. |
| 2010/0031875 A1 | 2/2010 | D'evelyn |
| 2010/0044718 A1 | 2/2010 | Hanser et al. |
| 2010/0059790 A1 | 3/2010 | Takeuchi |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'evelyn |
| 2010/0195687 A1 | 8/2010 | Okamoto et al. |
| 2010/0220262 A1 | 9/2010 | Demille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2010/0329297 A1 | 12/2010 | Rumpler et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0204376 A1 | 8/2011 | Su et al. |
| 2011/0216795 A1 | 9/2011 | Hsu et al. |
| 2011/0247556 A1 | 10/2011 | Raring et al. |
| 2012/0178198 A1 | 7/2012 | Raring et al. |
| 2012/0187412 A1 | 7/2012 | D'evelyn et al. |
| 2012/0314398 A1 | 12/2012 | Raring et al. |
| 2013/0214284 A1 | 8/2013 | Holder et al. |
| 2013/0234111 A1 | 9/2013 | Pfister et al. |
| 2013/0313516 A1 | 11/2013 | David et al. |
| 2014/0023102 A1 | 1/2014 | Holder et al. |
| 2015/0111325 A1 | 4/2015 | Hsu et al. |
| 2015/0140710 A1 | 5/2015 | McLaurin et al. |
| 2015/0229100 A1 | 8/2015 | Sztein et al. |
| 2015/0229107 A1 | 8/2015 | McLaurin et al. |
| 2015/0229108 A1 | 8/2015 | Steigerwald et al. |
| 2016/0294162 A1 | 10/2016 | McLaurin et al. |
| 2016/0359294 A1 | 12/2016 | Sztein et al. |
| 2016/0372893 A1 | 12/2016 | McLaurin et al. |
| 2017/0063045 A1 | 3/2017 | McLaurin et al. |
| 2017/0063047 A1 | 3/2017 | McLaurin et al. |

FOREIGN PATENT DOCUMENTS

| | | |
|---|---|---|
| DE | 102014223196 | 8/2015 |
| JP | 2007068398 | 3/2007 |
| JP | 2007173467 | 7/2007 |
| WO | 2008041521 | 4/2008 |
| WO | 2015120118 | 8/2015 |

OTHER PUBLICATIONS

U.S. Appl. No. 14/580,693 Notice of Allowance dated Jan. 17, 2017, 11 pages.

Gallium nitride, Retrieved from http://en.wikipedia.org/wiki/Gallium_nitride, Dec. 31, 2014, 6 pages.

Light-emitting diode Retrieved from http://en.wikipedia.org/wiki/Light-emitting diode, Dec. 31, 2014, 44 pages.

Power electronics, Retrieved from http://en.wikipedia.org/wiki/Power_electronics, Dec. 31, 2014, 24 pages.

Transistor, Retrieved from http://en.wikipedia.org/wiki/Transistor, Dec. 31, 2014, 25 pages.

Non-Final Office Action dated Jun. 27, 2011, in U.S. Appl. No. 12/481,543, 10 pages.

Final Office Action dated Aug. 12, 2011 in U.S. Appl. No. 12/482,440, 7 pages.

U.S. Appl. No. 12/482,440, Non-Final Office Action dated Feb. 23, 2011, 6 pages.

U.S. Appl. No. 12/484,924, Final Office Action dated Oct. 31, 2011, 11 pages.

U.S. Appl. No. 12/484,924, Non-Final Office Action dated Apr. 14, 2011, 12 pages.

U.S. Appl. No. 12/491,169, Office Action dated May 11, 2011.

U.S. Appl. No. 12/491,169, Office Action dated Oct. 22, 2010.

U.S. Appl. No. 12/497,289, Non-Final Office Action dated Feb. 2, 2012, 7 pages.

U.S. Appl. No. 12/497,289, Notice of Allowance dated May 22, 2012, 7 pages.

U.S. Appl. No. 12/502,058, Final Office Action dated Aug. 19, 2011, 13 pages.

U.S. Appl. No. 12/502,058, Non-Final Office Action dated Dec. 8, 2010, 15 pages.

(56) References Cited

OTHER PUBLICATIONS

U.S. Appl. No. 12/502,058, Notice of Allowance dated Apr. 16, 2012, 10 pages.
U.S. Appl. No. 12/534,829, Non-Final Office Action dated Apr. 19, 2011, 9 pages.
U.S. Appl. No. 12/534,829, Notice of Allowance dated Dec. 5, 2011, 10 pages.
U.S. Appl. No. 12/534,829, Notice of Allowance dated Oct. 28, 2011, 10 pages.
U.S. Appl. No. 12/534,829, Notice of Allowance dated Dec. 21, 2011, 4 pages.
U.S. Appl. No. 12/573,820, Office Action dated Mar. 2, 2011.
U.S. Appl. No. 12/573,820, Office Action dated Oct. 11, 2011.
U.S. Appl. No. 12/573,820, filed Oct. 5, 2009.
U.S. Appl. No. 12/727,148, filed Mar. 18, 2010.
U.S. Appl. No. 12/749,466, Final Office Action dated Feb. 3, 2012, 16 pages.
U.S. Appl. No. 12/749,466, Non-Final Office Action dated Jun. 29, 2011, 20 pages.
U.S. Appl. No. 12/749,476, Final Office Action dated Nov. 8, 2011, 11 pages.
U.S. Appl. No. 12/749,476, Non-Final Office Action dated Apr. 11, 2011, 15 pages.
U.S. Appl. No. 12/749,476, Notice of Allowance dated May 4, 2012, 13 pages.
U.S. Appl. No. 12/759,273, Non-Final Office Action dated Nov. 21, 2011, 10 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/868,441, Non-Final Office Action dated Apr. 30, 2012, 12 pages.
U.S. Appl. No. 12/873,820, Non-Final Office Action dated Oct. 4, 2012, 10 pages.
U.S. Appl. No. 12/880,803, Non-Final Office Action dated Feb. 22, 2012, 9 pages.
U.S. Appl. No. 12/880,889, filed Sep. 13, 2010.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Non-Final Office Action dated Apr. 17, 2012, 8 pages.
U.S. Appl. No. 12/884,993, Final Office Action dated Aug. 2, 2012, 15 pages.
U.S. Appl. No. 12/884,993, Non-Final Office Action dated Mar. 16, 2012, 15 pages.
U.S. Appl. No. 12/884,993, Notice of Allowance dated Nov. 26, 2012, 11 pages.
U.S. Appl. No. 13/014,622, Final Office Action dated Apr. 30, 2012, 14 pages.
U.S. Appl. No. 13/014,622, Non-Final Office Action dated Nov. 28, 2011, 14 pages.
U.S. Appl. No. 13/046,565, Final Office Action dated Feb. 2, 2012, 17 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 14/175,622, Non-Final Office Action dated Apr. 27, 2015, 13 pages.
U.S. Appl. No. 14/175,622, Notice of Allowance dated Aug. 10, 2015, 9 pages.
U.S. Appl. No. 14/176,403, Corrected Notice of Allowability dated Mar. 28, 2016, 2 pages.
U.S. Appl. No. 14/176,403, Non-Final Office Action dated Sep. 11, 2015, 13 pages.
U.S. Appl. No. 14/176,403, Notice of Allowance dated Feb. 12, 2016, 8 pages.
U.S. Appl. No. 14/312,427, Corrected Notice of Allowability dated Mar. 31, 2016, 2 pages.
U.S. Appl. No. 14/312,427, Final Office Action dated Dec. 16, 2015, 18 pages.
U.S. Appl. No. 14/312,427, Non-Final Office Action dated Aug. 21, 2015, 13 pages.
U.S. Appl. No. 14/312,427, Notice of Allowance dated Mar. 4, 2016, 8 pages.
U.S. Appl. No. 14/312,427, Restriction Requirement dated May 18, 2015, 7 pages.
U.S. Appl. No. 14/480,398, Non-Final Office Action dated Mar. 17, 2016, 17 pages.
U.S. Appl. No. 14/480,398, Notice of Allowance dated Aug. 12, 2016, 9 pages.
U.S. Appl. No. 14/480,398, Restriction Requirement dated Oct. 22, 2015, 5 pages.
U.S. Appl. No. 14/534,636, Non-Final Office Action dated Jun. 3, 2015, 9 pages.
U.S. Appl. No. 14/534,636, Notice of Allowance dated Sep. 15, 2015, 11 pages.
U.S. Appl. No. 14/559,149, Corrected Notice of Allowability dated Mar. 21, 2016, 2 pages.
U.S. Appl. No. 14/559,149, Notice of Allowance dated Feb. 17, 2016, 10 pages.
U.S. Appl. No. 14/559,149, Restriction Requirement dated Oct. 29, 2015, 6 pages.
U.S. Appl. No. 14/580,693, Non-Final Office Action dated Jun. 16, 2016, 23 pages.
U.S. Appl. No. 14/580,693, filed Dec. 23, 2014.
U.S. Appl. No. 14/600,506, Non-Final Office Action dated Mar. 8, 2016, 7 pages.
U.S. Appl. No. 14/600,506, Notice of Allowance dated Aug. 9, 2016, 8 pages.
U.S. Appl. No. 14/600,506, Restriction Requirement dated Nov. 25, 2015, 6 pages.
U.S. Appl. No. 14/931,743, Notice of Allowance dated Mar. 31, 2016, 10 pages.
U.S. Appl. No. 14/968,710, filed Dec. 14, 2015.
U.S. Appl. No. 15/173,441, Non-Final Office Action dated Dec. 29, 2016, 6 pages.
U.S. Appl. No. 15/173,441, filed Jun. 3, 2016.
U.S. Appl. No. 15/176,076, Restriction Requirement dated Dec. 30, 2016, 4 pages.
U.S. Appl. No. 15/176,076, filed Jun. 7, 2016.
U.S. Appl. No. 15/177,710, Non-Final Office Action dated Dec. 30, 2016.
U.S. Appl. No. 15/177,710, filed Jun. 9, 2016.
U.S. Appl. No. 15/180,737, filed Jun. 13, 2016.
U.S. Appl. No. 15/209,309, Notice of Allowance dated Dec. 19, 2016, 12 pages.
U.S. Appl. No. 15/209,309, filed Jul. 13, 2016.
U.S. Appl. No. 15/559,149, filed Jun. 9, 2016.
U.S. Appl. No. 61/164,409, filed Mar. 28, 2009.
U.S. Appl. No. 61/182,105, filed May 29, 2009.
U.S. Appl. No. 61/249,568, filed Oct. 7, 2009.
Abare et al., Cleaved and Etched Facet Nitride Laser Diodes, IEEE Journal of Selected Topics in Quantum Electronics, vol. 4, No. 3, May 1998, pp. 505-509.

(56) References Cited

OTHER PUBLICATIONS

Amano et al., p-type conduction in Mg-doped GaN treated with low-energy electron beam irradiation (LEEBI), Japanese Journal of Applied Physics, vol. 28, No. 12, Dec. 1989, pp. L2112-L2114.
Aoki et al., InGaAs/InGaAsP MQW electroabsorption modulator integrated with a DFB laser fabricated by band-gap energy control selective area MOCVD, IEEE Journal of Quantum Electronics, vol. 29, No. 6, Jun. 1993, pp. 2088-2096.
Asano et al., 100-mW kink-free blue-violet laser diodes with low aspect ratio, IEEE Journal of Quantum Electronics, vol. 39, No. 1, Jan. 2003, pp. 135-140.
Bernardini et al., Spontaneous polarization and piezoelectric constants of III-V nitrides, Physical Review B, vol. 56, No. 16, Oct. 15, 1997, pp. 10024-10027.
Caneau et al., Studies on the selective OMVPE of (Ga,In)/(As,P), Journal of Crystal Growth, vol. 124, No. 1-4, Nov. 1, 1992, pp. 243-248.
Chen et al., Growth and Optical Properties of Highly Uniform and Periodic InGaN Nanostructures, Advanced Materials, vol. 19, Jun. 5, 2007, pp. 1707-1710.
Chinese Patent Application No. 201520826757.6, Office Action dated Mar. 3, 2016, 3 pages (1 page for the original document and 2 pages for the English translation).
D'Evelyn et al., Bulk GaN crystal growth by the high-pressure ammonothermal method, Journal of Crystal Growth, vol. 300, Issue 1, Mar. 1, 2007, pp. 11-16.
Founta et al., Anisotropic Morphology of Nonpolar a-Plan GaN Quantum Dots and Quantum Wells, Journal of Applied Physics, vol. 102, No. 7, 2007, pp. 074304-1-074304-6.
Fujii et al., Increase in the extraction efficiency of GaN-based light-emitting diodes via surface roughening, Applied Physics Letters, vol. 84, No. 6, 2004, pp. 855-857.
Funato et al., Blue, Green, and Amber InGaN/GaN Light-Emitting Diodes on Semipolar {11-22} GaN Bulk Substrates, Journal of Japanese Applied Physics, vol. 45, No. 26, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, No. 1, 2008, pp. 011106-1-011106-3.
Gardner et al., Blue-emitting InGaN—GaN double-heterostructure light-emitting diodes reaching maximum quantum efficiency above 200A/cm2, Applied Physics Letters, vol. 91, Dec. 12, 2007, pp. 243506-1-243506-3.
Hiramatsu et al., Selective area growth and epitaxial lateral overgrowth of GaN by metalorganic vapor phase epitaxy and hydride vapor phase epitaxy, Materials Science and Engineering B, vol. 59, May 6, 1999, pp. 104-111.
Hjort, Sacrificial etching of III-V compounds for micromechanical devices, J. Micromech. Miroeng., vol. 6, 1996, pp. 370-375.
Holder et al., Demonstration of Nonpolar GaN-Based Vertical-Cavity Surface-Emitting Lasers, Appl. Phys. Express, vol. 5, No. 9, 2012, pp. 092104-1-092104-3.
Iso et al., High Brightness Blue InGaN/GaN Light Emitting Diode on Nonpolar m-plane Bulk GaN Substrate, Japanese Journal of Applied Physics, vol. 46, No. 40, 2007, pp. L960-L962.
Kendall et al., Energy Savings Potential of Solid State Lighting in General Lighting Applications, Report for the Department of Energy, 2001, 35 pages.
Khan, Cleaved cavity optically pumped InGaN—GaN laser grown on spinel substrates, Applied Physics Letters, vol. 69, Issue 16, Oct. 14, 1996, pp. 2417-2420.
Kim et al., Improved Electroluminescence on Nonpolar m-plane InGaN/GaN Qantum Well LEDs, Physica Status Solidi (RRL), vol. 1, No. 3, 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, 2001, pp. L925-L927.
Lidow et al., GaN Technology Overview, EPC White Paper, 2012, 6 pages.

Lin et al., Influence of Separate Confinement Heterostructure Layer on Carrier Distribution in InGaAsP Laser Diodes with Nonidentical Multiple Quantum Wells, Japanese Jouranal of Appliedd Physics, vol. 43, No. 1 0, 2004, pp. 7032-7035.
Masui et al., Electrical Characteristics of Nonpolar InGaN-Based Light-Emitting Diodes Evaluated at Low Temperature, Japanese Journal of Applied Physics, vol. 46, Part 1, No. 11, 2007, pp. 7309-7310.
Michiue et al., Recent development of nitride LEDs and LDs, Proceedings of SPIE, vol. 7216, 2009, pp. 72161Z-1-72161Z-6.
Nakamura et al., Candera-class high-brightness InGaN/AigaN double-heterostructure blue-light-emitting diodes, Appl. Phys. Lett. ,vol. 64, 1994, pp. 1687-1689.
Nakamura et al., InGaN/GaN/AlGaN-based laser diodes with modulation-doped strained-layer superlattices grown on an epitaxially laterally overgrown GaN substrate, Applied Physics Letters, vol. 72, No. 12, 1998, pp. 211-213.
Nakamura et al., p-GaN/n-InGaN/n-GaN doubleheterostructure blue-light-emitting diodes, Jpn. J. Appl. Phys., vol. 32, 1993, pp. L8-L11.
Nam et al., Lateral epitaxial overgrowth of GaN films on SiO2 areas via metalorganic vapor phase epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, The Japan Society of Applied Physics JJAP Express LEtter, vol. 46, No. 9, 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express 1, Jun. 20, 2008, pp. 072201-1-072201-3.
Okamoto et al., Pure Blue Laser Diodes Based on Nonpolar m-Piane Gallium Nitride with InGaN Waveguiding Layers, Journal of Japanese Applied Physics, vol. 46, No. 35, 2007, pp. L820-L822.
Park, Crystal orientation effects on electronic properties of wurtzite InGaN/GaN quantum wells, Journal of Applied Physics, vol. 91, No. 12, Jun. 15, 2002, pp. 9904-9908.
International Application No. PCT/US2009/046786, International Search Report dated May 13, 2010, 2 pages.
International Application No. PCT/US2009/047107, International Search Report dated Sep. 29, 2009, 4 pages.
International Application No. PCT/US2009/052611, International Search Report dated Sep. 29, 2009, 3 pages.
International Application No. PCT/US2010/030939, International Search Report and Written Opinion dated Jun. 16, 2010, 9 pages.
International Application No. PCT/US2010/049172, International Search Report and Written Opinion dated Nov. 17, 2010, 7 pages.
International Application No. PCT/US2011/037792, International Search Report and Written Opinion dated Sep. 8, 2011, 2 pages.
International Application No. PCT/US2015/014567, International Preliminary Report on Patentability dated Aug. 25, 2016, 14 pages.
International Application No. PCT/US2015/014567, International Search Report and Written Opinion dated Jul. 8, 2015, 19 pages.
International Application No. PCT/US2015/014567, Invitation to Pay Add'l Fees and Partial Search Report dated May 1, 2015, 2 pages.
Purvis, Changing the crystal face of gallium nitride, The Advance Semiconductor Magazine, III-Vs Review, vol. 18, No. 8, Nov. 8, 2005, pp. 26-28.
Romanov et al., Strain-induced polarization in wurtzite III-nitride semipolar layers, J. Appl. Phys., vol. 100, Jul. 25, 2006, pp. 023522-1-023522-10.
Sato et al., High Power and High Efficiency Green Light Emitting Diode on free-Standing Semipolar (1122) Bulk GaN Substrate, Physica Status Solidi (RRL), vol. 1, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, 2008, pp. 221110-1-221110-3.
Schmidt et al., Demonstration of Nonpolar m-Plane InGaN/GaN Laser Diodes, Japanese Journal of Applied Physics, vol. 46 Part 2, 2007, pp. 190-191.
Schmidt et al., High Power and High External Efficiency m-plane InGaN Light Emitting Diodes, Japanese Journal of Applied Physics, vol. 46, No. 7, Feb. 9, 2007, pp. L126-L128.

(56) References Cited

OTHER PUBLICATIONS

Schoedl, Facet degradation of GaN heterostructure laser diodes, Journal of Applied Physics, vol. 97, No. 12, 2005, pp. 123102-1 to123102-8.

Shchekin et al., High Performance Thin-film Flip-Chip InGaN—GaN Light-emitting Diodes, Applied Physics Letters, vol. 89, Aug. 16, 2006, pp. 071109-1-071109-3.

Shen et al., Auger recombination in InGaN measured by photoluminescence, Applied Physics Letters , vol. 91, Oct. 1, 2007, pp. 141101-1-141101-3.

Sink, Cleaved-Facet Group-III Nitride Lasers, University of California, Santa Barbara, Ph.D. Dissertation, Dec. 2000, 251 pages.

Sizov et al., 500-nm Optical Gain Anisotropy of Semipolar (1122) InGaN Quantum Wells, Applied Physics Express, vol. 2, Jun. 19, 2009, pp. 071001-1-071001-3.

Tamboli, Photoelectrochemical etching of gallium nitride for high quality optical devices, http://adsabs.harvard.edu/abs/2009PhDT . . . 68T., 2009, 207 pages.

Tech On, Nichia Develops Blue-green Semiconductor Laser w/ 488nm Wavelength, hap://techon.nikkeibp.com jp/english/NEWS_EN/20080122/146009, 2 pages.

Tomiya et al., Dislocation related issues in the degradation of GaN-based laser diodes, IEEE Journal of Selected Topics in Quantum Electronics, vol. 10, Issue 6, Nov.-Dec. 2004, pp. 1277-1286.

Tyagi et al., High Brightness Violet InGan/Gan Light EMitting Diodes on Semipolar (1011) Bulk Gan Substrates, Japanese Journal of Applied Physics, vol. 46, No. 4-7, Feb. 9, 2007, pp. L129-L131.

Uchida et al., Recent progress in high-power blue-violet lasers, IEEE Journal of Selected Topics in Quantum Electronics, vol. 9, Issue 5, Sep.-Oct. 2003, pp. 1252-1259.

Waltereit et al., Nitride semiconductors free of electrostatic fields for efficient white light-emitting diodes, Nature, vol. 406, Aug. 24, 2000, pp. 865-868.

Wierer et al., High-power AlGaInN flip-chip light-emitting diodes, Applied Physics Letters, vol. 78, No. 22, 2001, pp. 3379-3381.

Yamaguchi, Anisotropic optical matrix elements in strained GaN-quantum wells with various substrate orientations, Physical Status Solidi (PSS), vol. 5, No. 6, May 2008, pp. 2329-2332.

Yang, Micromachining of Gan Using Photoelectrochemical Etching, Graduate Program in Electronic Engineering, Notre Dame, Indiana, 2005, 168 pages.

Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.

Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, OSA Technical Digest (CD), 2007, pp. 1-2.

Zhong et al., Demonstration of High Power Blue-Green Light Emitting Diode on Semipolar (1122) bulk GaN substrate, Electronics Letters, vol. 43, No. 15, Jul. 2007, pp. 825-826.

Zhong et al., High power and high efficiency blue light emitting diode on freestanding semipolar (1011) bulk GaN substrate, Applied Physics Letter, vol. 90, No. 23, 2007, pp. 233504-1-233504-3.

U.S. Appl. No. 15/173,441, Notice of Allowance dated Apr. 13, 2017, 8 pages.

U.S. Appl. No. 15/176,076, Non-Final Office Action dated Jun. 6, 2017, 14 pages.

U.S. Appl. No. 15/177,710, Notice of Allowance dated May 2, 2017, 10 pages.

U.S. Appl. No. 15/480,239, Non-Final Office Action dated Jul. 3, 2017, 13 pages.

U.S. Appl. No. 15/351,326 Non-Final Office Action dated Jul. 14, 2017, 15 pages.

Extended European Search Report dated Jul. 11, 2017, 11 pages.

U.S. Appl. No. 15/180,737, Notice of Allowance dated Aug. 25, 2017, 11 pages.

U.S. Appl. No. 15/480,239, Final Office Action dated Oct. 24, 2017, 15 pages.

U.S. Appl. No. 15/176,076 Final Office Action dated Dec. 8, 2017, 12 pages.

U.S. Appl. No. 15/675,532 Non-Final Office Action dated Dec. 18, 2017, 11 pages.

ITO/laser epi/GaN wafer is bonded directly or indirectly to a carrier wafer. This carrier wafer can be made of a number of different materials

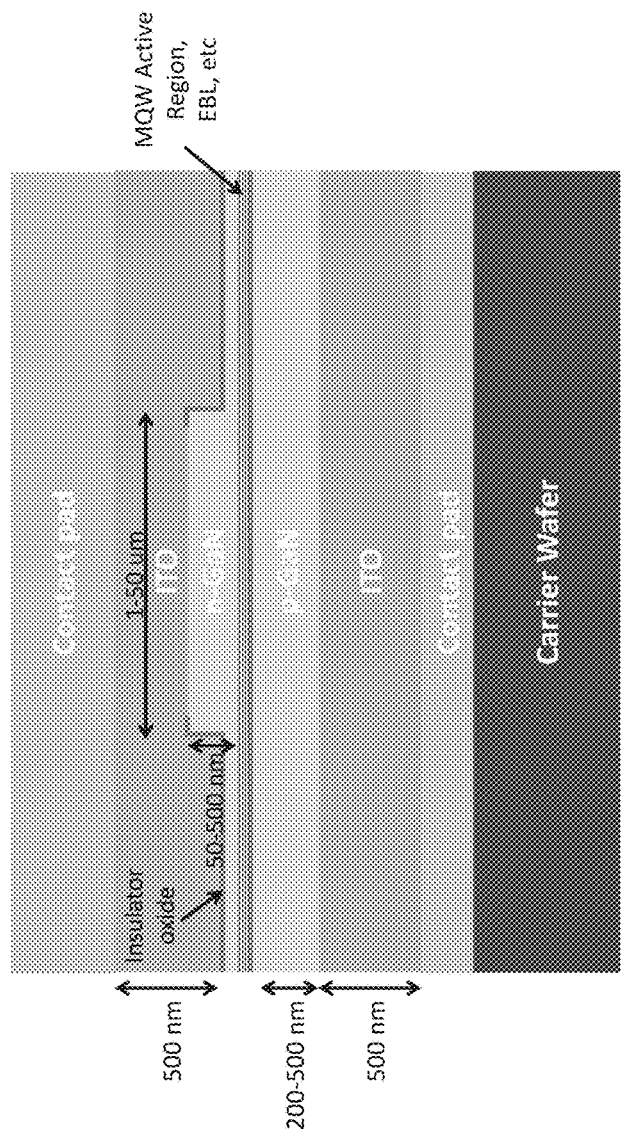
Figure 3a Double ITO Clad, n-ridge

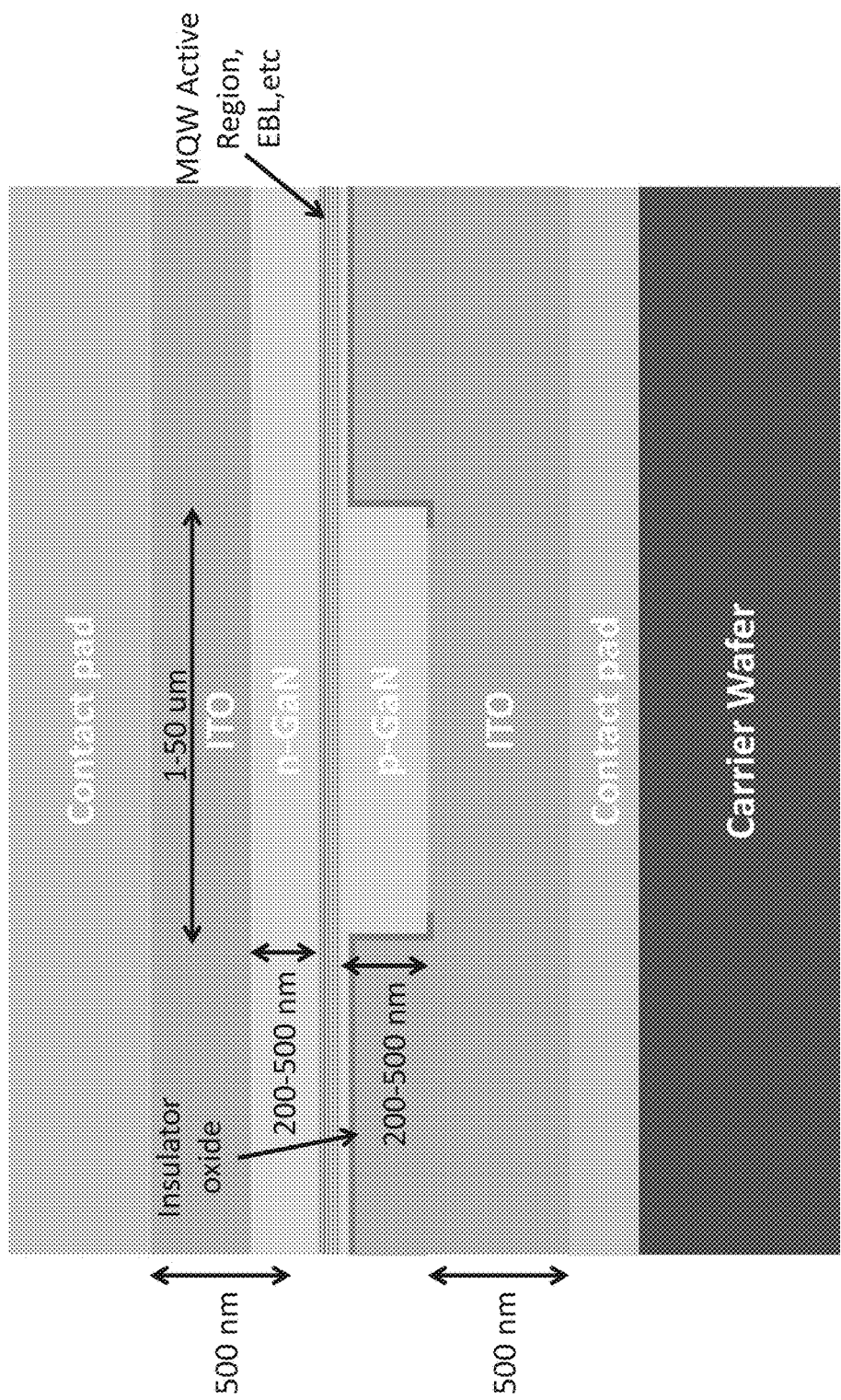
Figure 3b Double ITO Clad, p-ridge

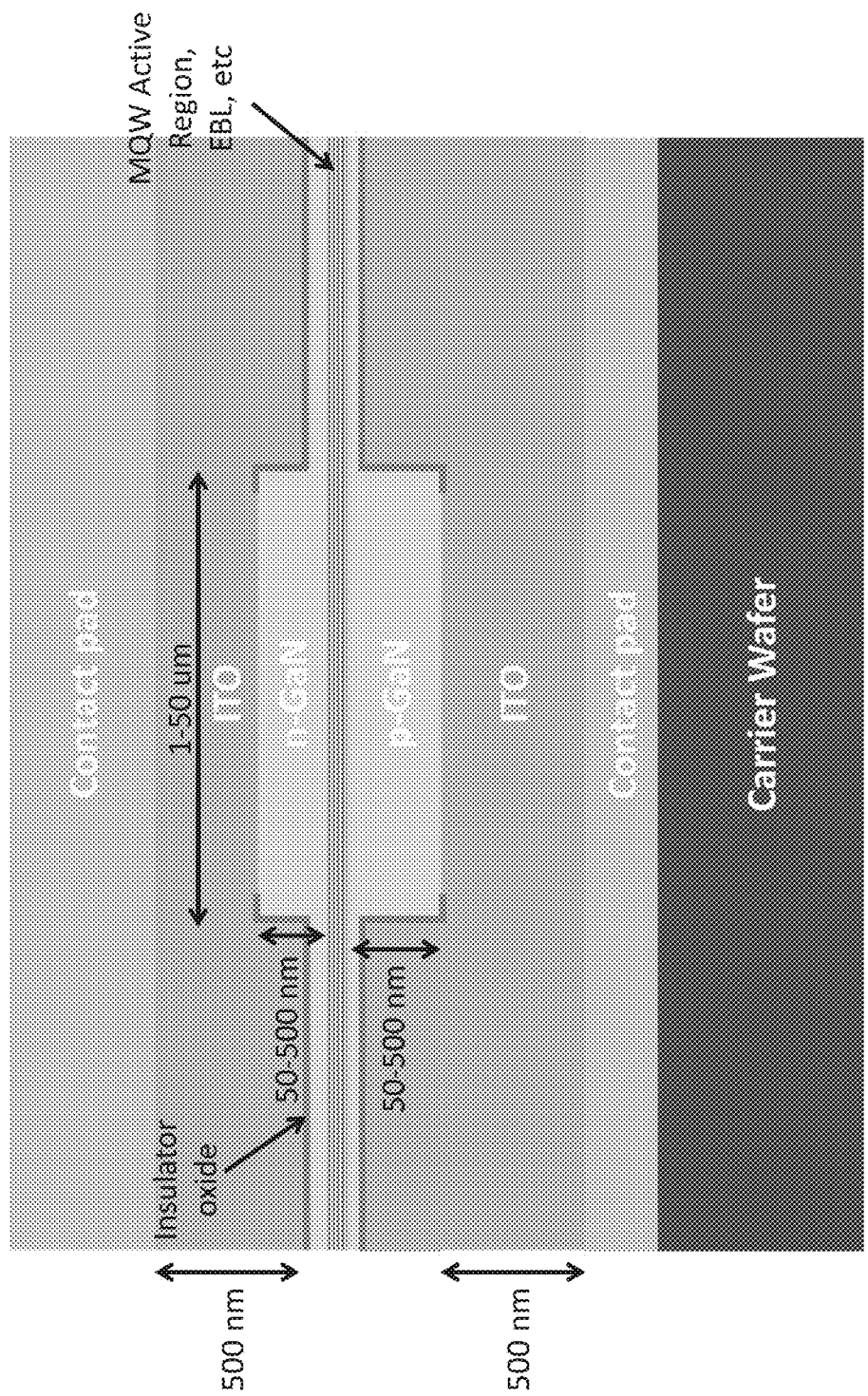
Figure 3c Double ITO Clad, p/n-ridge

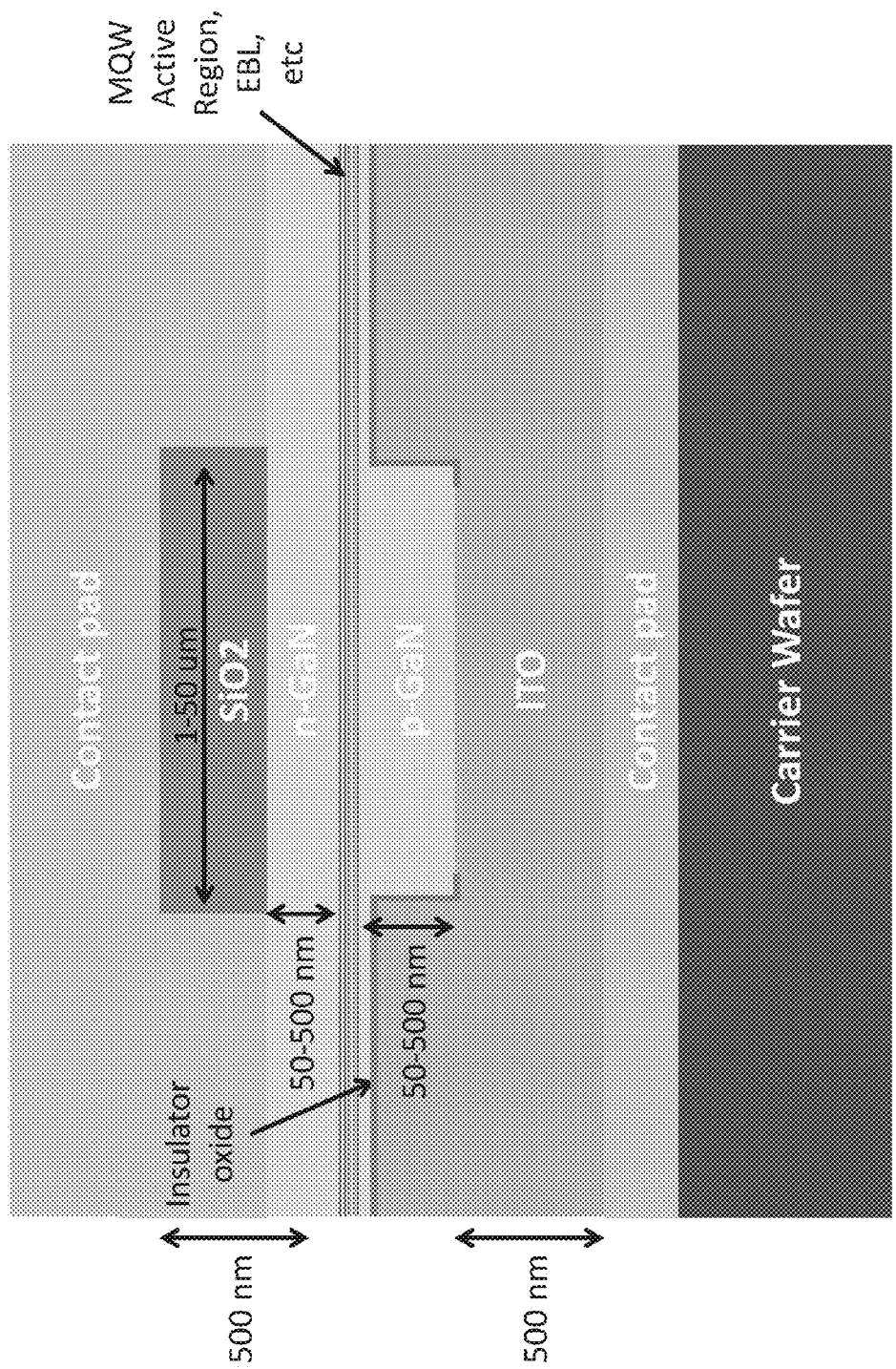
Figure 3d ITO p-clad, SiO2 n-clad, p-ridge

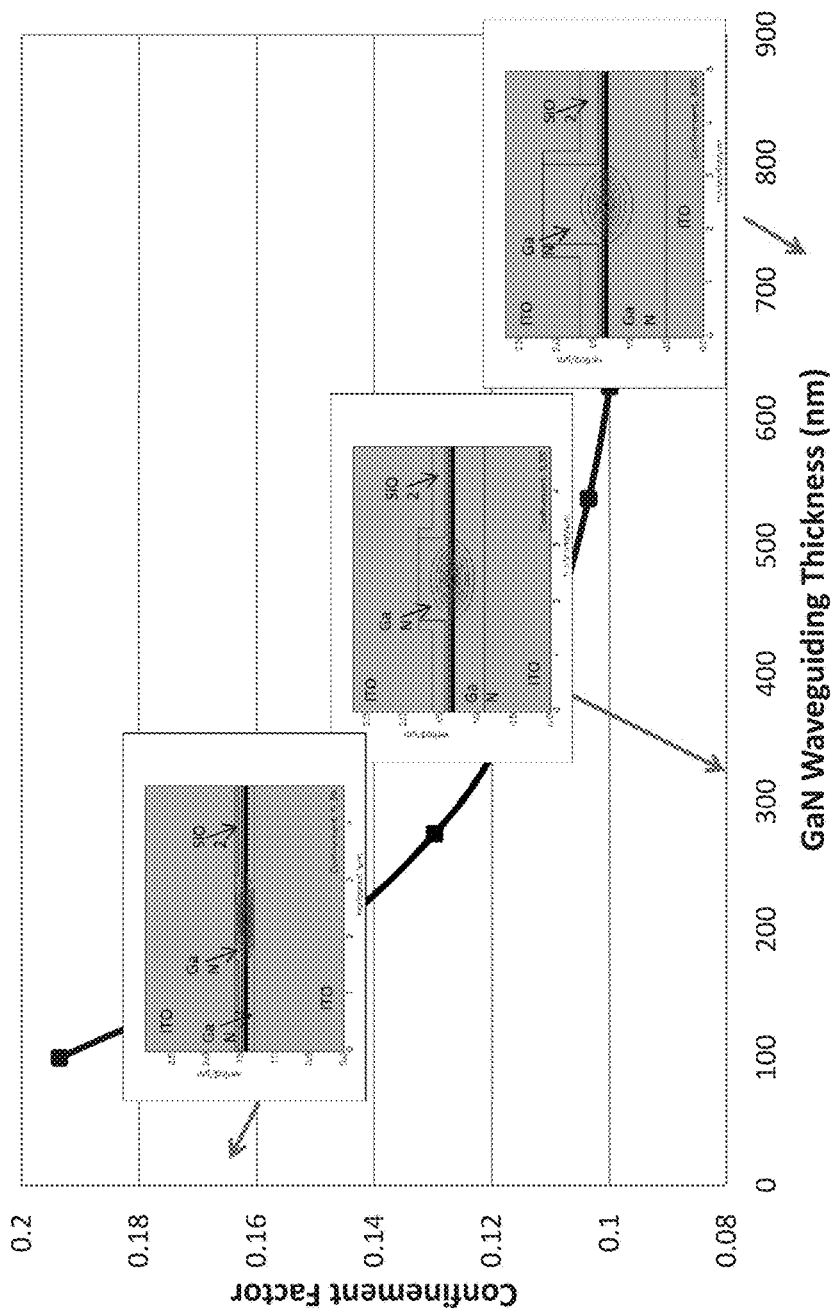
Figure 5 Simulation of optical confinement

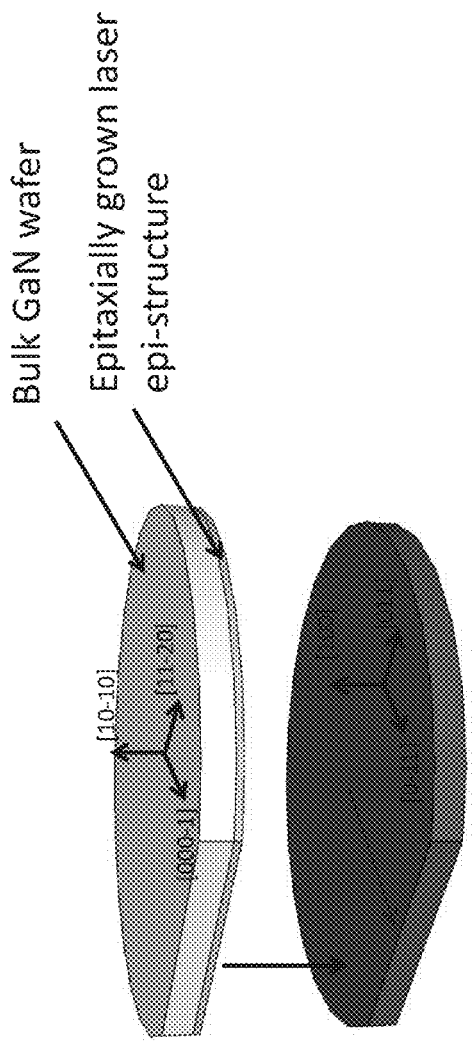
Figure 6a Handle wafer assisted cleaving
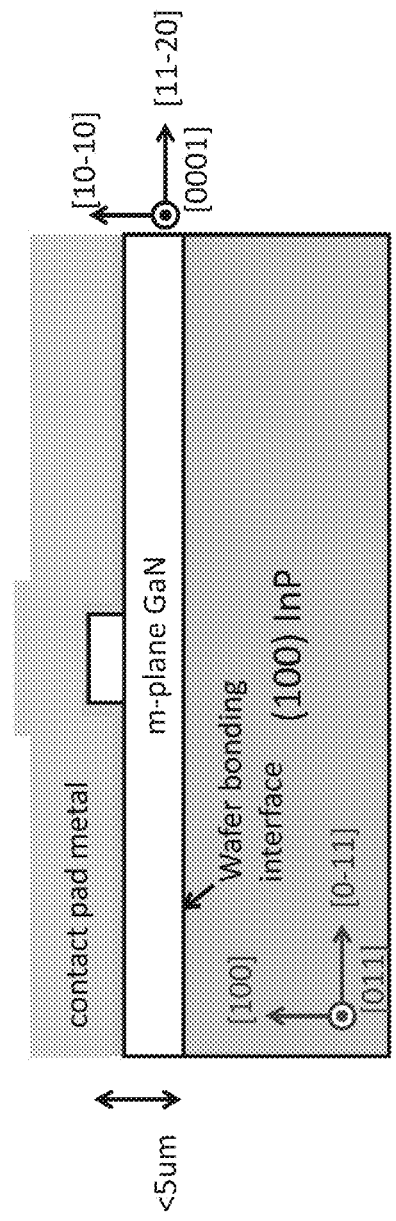
Figure 6b

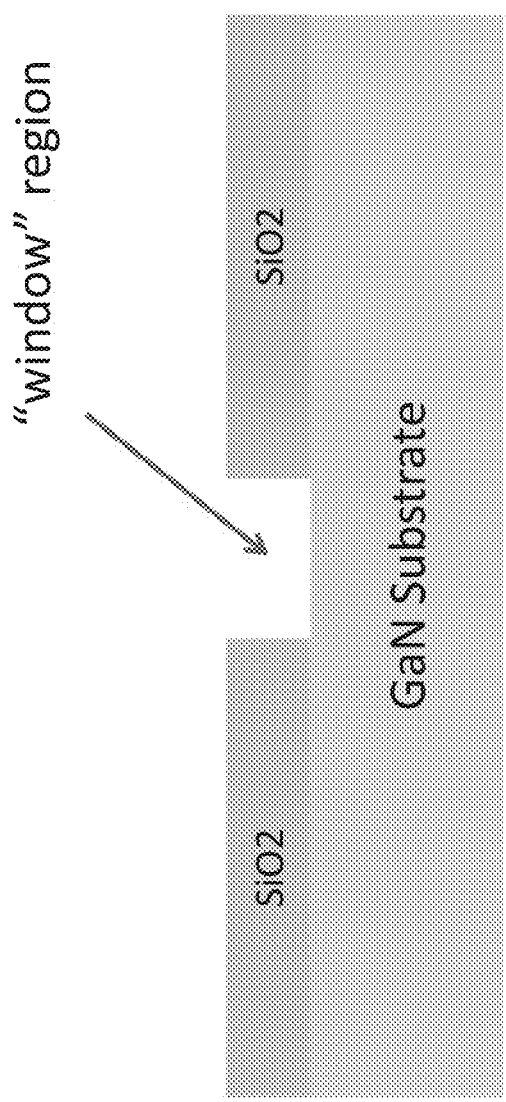
Figure 9a: LEO process: Pattern substrate

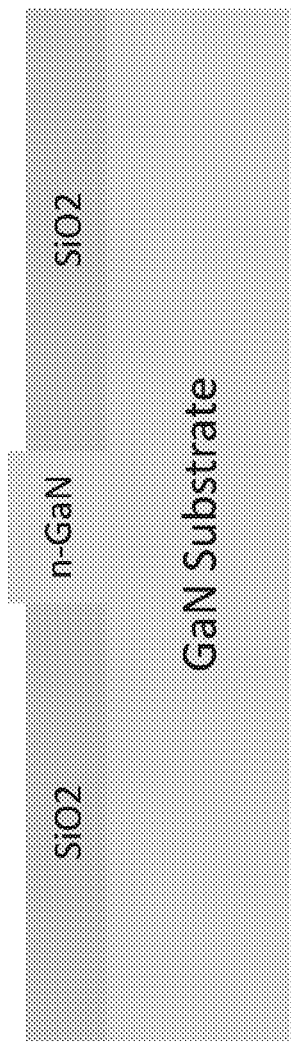
Figure 9b: LEO process: Perform vertical growth

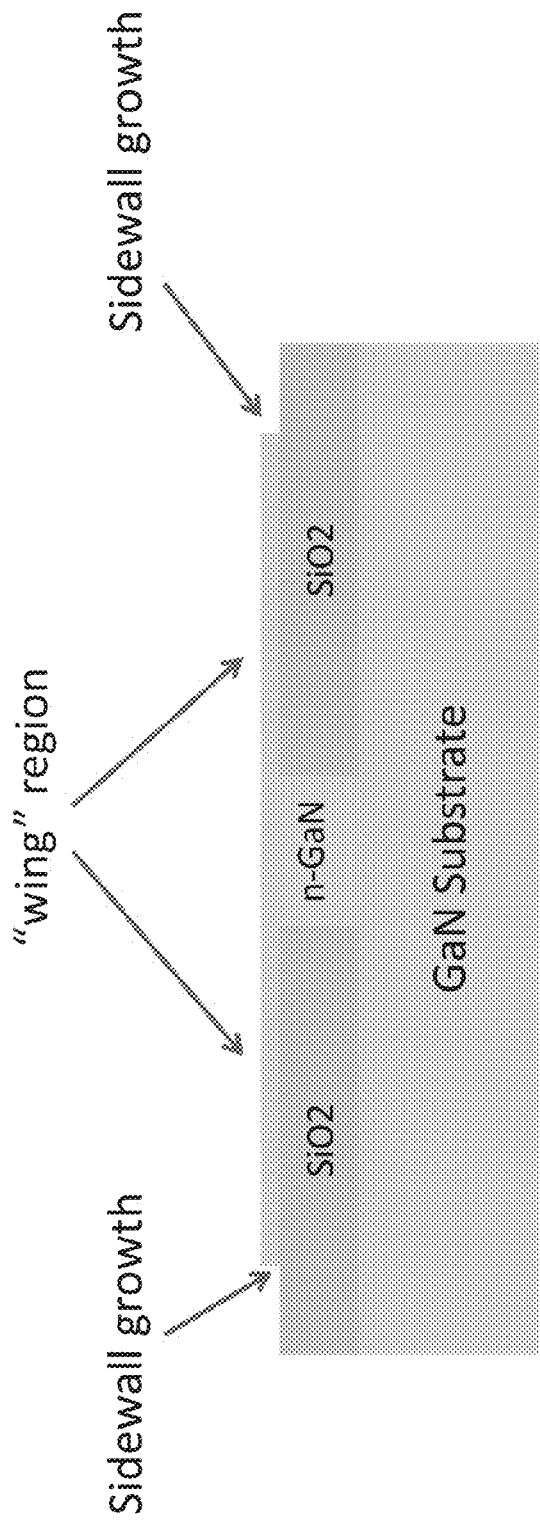
Figure 9c: LEO process: Perform lateral growth

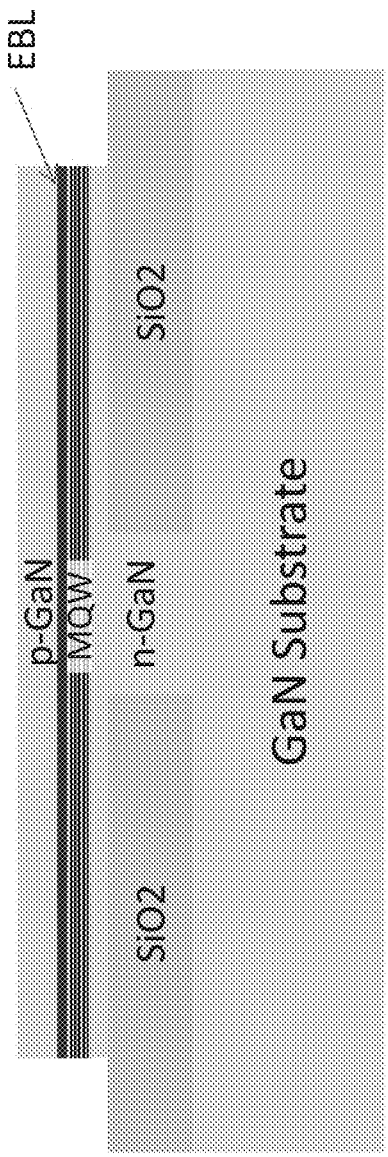
Figure 9d: LEO process: Perform active region growth

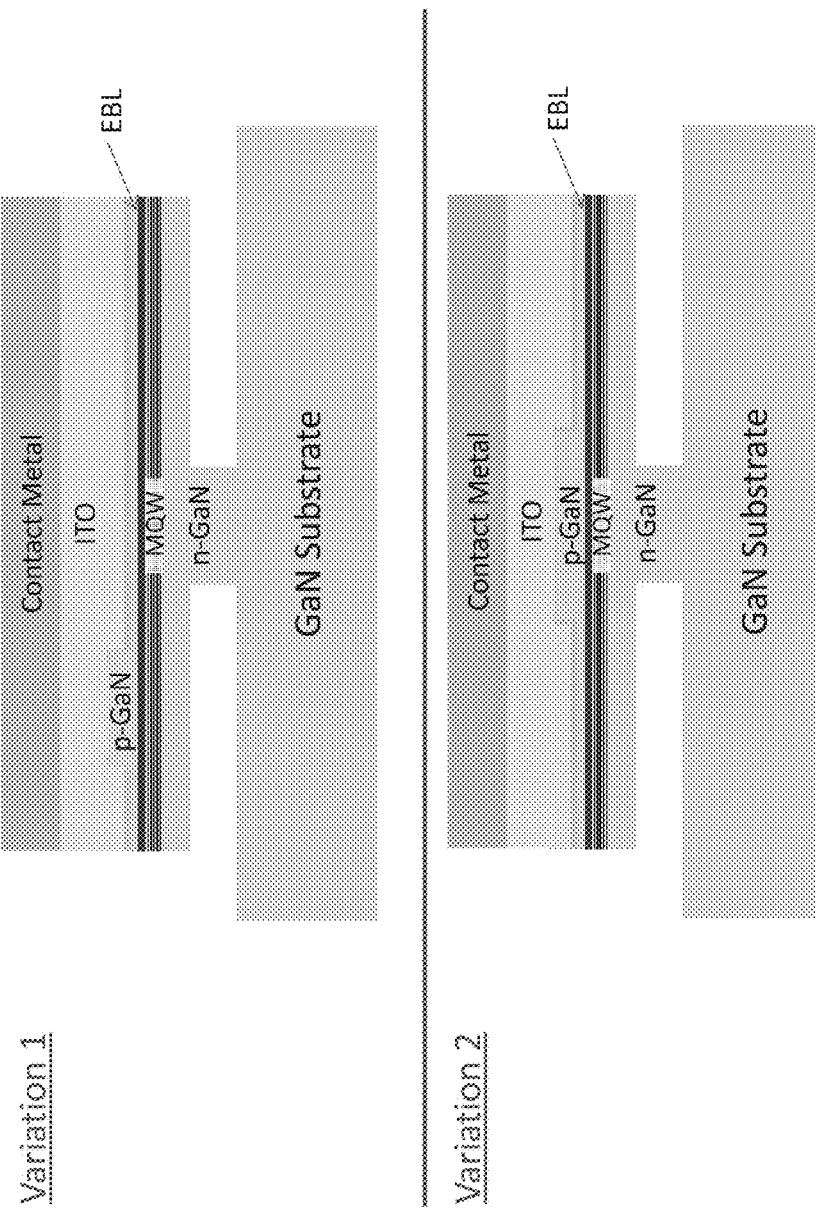

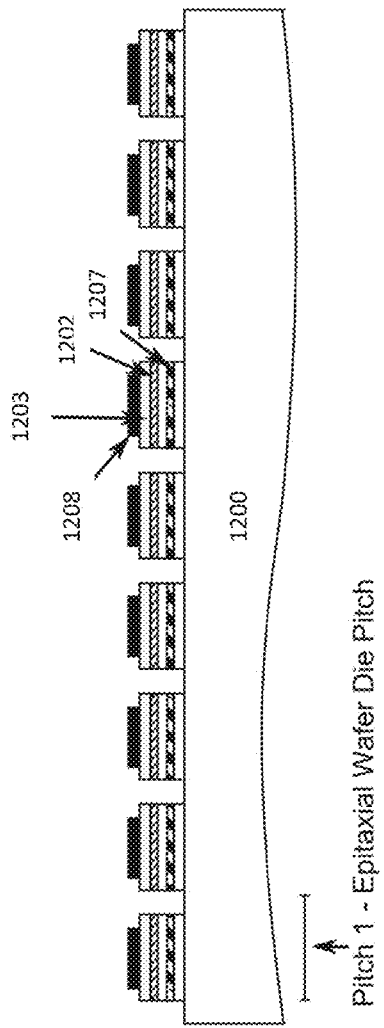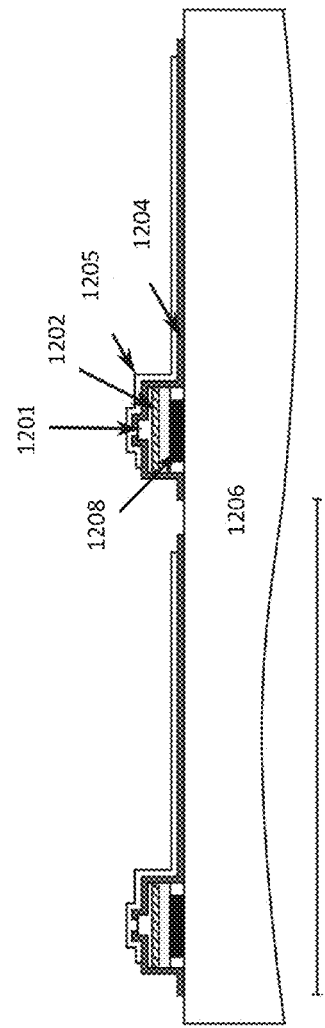
FIGURE 12

GALLIUM AND NITROGEN CONTAINING LASER DEVICE HAVING CONFINEMENT REGION

CROSS REFERENCE TO RELATED APPLICATIONS

This application is a divisional of U.S. patent application Ser. No. 14/480,398, filed Sep. 8, 2014, which claims priority to U.S. Ser. No. 61/892,981, filed Oct. 18, 2013, both of which are commonly assigned and hereby incorporated by reference herein.

BACKGROUND

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized to replace the inefficient and fragile lamps. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5%-10%, and further commercialization ensue into more high-end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser operating with longitudinal mode (single frequency) and single spatial mode, 1064 nm goes into frequency conversion crystal, which converts to visible 532 nm green light. These lasers designs are meant to improve the efficiency, cost and size compared to DPSS-SHG lasers, but the specialty single mode diodes, high precision laser beam alignment, and crystals required make this challenging today. Additionally, while the diode-SHG lasers have the benefit of being directly modulate-able, they suffer from severe sensitivity to temperature, which limits their application.

SUMMARY

The present disclosure relates generally to optical techniques. More specifically, the present disclosure provides methods and devices using nonpolar, semi-polar, or polar c-plane oriented gallium and nitrogen containing substrates for optical applications ranging in the violet, blue, and green spectral region, among others, including combinations thereof, and the like.

In an example, the present invention provides a method for fabricating a laser diode device. The method includes providing a gallium and nitrogen containing substrate member comprising a surface region, a release material overlying the surface region, an n-type gallium and nitrogen containing material, an active region overlying the n-type gallium and nitrogen containing material, a p-type gallium and nitrogen containing material; and a first transparent conductive oxide material overlying the p-type gallium and nitrogen containing material, and an interface region overlying the first transparent conductive oxide material. The method includes bonding the interface region to a handle substrate and subjecting the release material to an energy source to initiate release of the gallium and nitrogen containing substrate member.

In an example, the interface region is comprised of metal, a semiconductor and/or another transparent conductive oxide. In an example, the interface region comprises a contact material.

In an example, the energy source is selected from a light source, a chemical source, a thermal source, or a mechanical source, and their combinations. In an example, the release material is selected from a semiconductor, a metal, or a dielectric. In an example, the release material is selected from GaN, InGaN, AlInGaN, or AlGaN such that the InGaN is released using PEC etching. In an example, the active region comprises a plurality of quantum well regions.

In an example, the method comprises forming a ridge structure configured with the n-type gallium and nitrogen containing material to form an n-type ridge structure, and forming a dielectric material overlying the n-type gallium and nitrogen containing material, and forming a second transparent conductive oxide material overlying an exposed portion of the n-type gallium and nitrogen containing material such that active region is configured between the first transparent conductive oxide material and the second conductive oxide material to cause an optical guiding effect within the active region. In an example, the method includes forming an n-type contact material overlying an exposed portion of the n-type gallium and nitrogen containing material or forming an n-type contact material overlying a conductive oxide material overlying an exposed portion of the n-type gallium and nitrogen containing material. In an example, the method includes forming an n-type contact region overlying an exposed portion of the n-type gallium and nitrogen containing material; forming a patterned transparent oxide region overlying a portion of the n-type contact region; and forming a thickness of metal material overlying the patterned transparent oxide region; wherein the p-type gallium and nitrogen containing material is configured as a ridge waveguide structure to form a p-type ridge structure.

In an example, the transparent conductive oxide is comprised of indium tin oxide or zinc oxide.

In an example, the method includes forming an n-type contact region overlying an exposed portion of the n-type gallium and nitrogen containing material; forming a patterned dielectric region overlying a portion of the n-type contact region; and forming a thickness of conformal metal material overlying the patterned dielectric region; wherein the p-type gallium and nitrogen containing material is configured as a ridge waveguide structure to form a p-type ridge structure. In an example, the dielectric region is comprised of silicon oxide or silicon nitride. In an example, the method includes forming a ridge waveguide region in or overlying the n-type gallium and nitrogen containing material to form an n-type ridge structure; forming a second conductive oxide region overlying the n-type gallium and nitrogen containing material; and forming a metal material overlying the transparent oxide region.

In an example, the handle substrate is selected from a semiconductor, a metal, or a dielectric or combinations thereof. In an example, the handle substrate is selected from a silicon wafer or a gallium arsenide wafer or an indium phosphide wafer. In an example, the bonding comprising thermal bonding, plasma activated bonding, anodic bonding, chemical bonding, or combinations thereof. In an example, the surface region of the gallium and nitrogen containing substrate is configured in a semipolar, polar, or non-polar orientation.

In an example, the method further comprising forming a laser cavity is oriented in a c-direction or a projection of a c-direction and forming a pair of cleaved facets using a cleave propagated through both the handle substrate material and the gallium and nitrogen containing material. The method also further comprising forming a laser cavity is oriented in a c-direction or a projection of a c-direction and forming a pair of etched facets.

In an example, the handle substrate is an indium phosphide substrate material; and further comprising separating a plurality of laser dice by initiating a cleaving process on the indium phosphide substrate material. In an example, the handle substrate is a gallium arsenide substrate material; and further comprising separating a plurality of laser dice by initiating a cleaving process on the gallium arsenide substrate material. In an example, the method further comprises separating a plurality of laser dice by initiating a cleaving process on the handle substrate.

In an example, the present invention provides a method for fabricating a laser diode device. The method includes providing a gallium and nitrogen containing substrate member comprising a surface region, a release material overlying the surface region, an n-type gallium and nitrogen containing material; an active region overlying the n-type gallium and nitrogen containing material, a p-type gallium and nitrogen containing material; and a first transparent conductive oxide region overlying the p-type gallium and nitrogen containing material, and an interface region overlying the conductive oxide material. The method includes bonding the interface region to a handle substrate; and subjecting the release material to an energy source to initiate release of the gallium and nitrogen containing substrate member. In an example, the method includes forming a ridge structure configured with the n-type gallium and nitrogen containing material, and forming a dielectric material overlying the n-type gallium and nitrogen containing material, and forming a second transparent conductive oxide material overlying an exposed portion of the n-type gallium and nitrogen containing material such that active region is configured between the first transparent conductive oxide material and the second conductive oxide material to cause an optical guiding effect within the active region.

In an alternative example, the present invention provides a method for fabricating a laser diode device. The method includes providing a gallium and nitrogen containing substrate member comprising a surface region, a release material overlying the surface region, an n-type gallium and nitrogen containing material; an active region overlying the n-type gallium and nitrogen containing material, a p-type gallium and nitrogen containing material; and a first transparent conductive oxide region overlying the p-type gallium and nitrogen containing material, and an interface region overlying the conductive oxide material. The method includes bonding the interface region to a handle substrate; and subjecting the release material to an energy source to initiate release of the gallium and nitrogen containing substrate member. The method includes forming an n-type contact region overlying an exposed portion of the n-type gallium and nitrogen containing material; forming a patterned second transparent oxide region overlying a portion of the n-type contact region; and forming a thickness of metal material overlying the patterned transparent oxide region; wherein the p-type gallium and nitrogen containing material is configured as a ridge waveguide structure to form a p-type ridge structure.

In an example, the present invention provides a method for fabricating a laser diode device. The method includes providing a gallium and nitrogen containing substrate member comprising a surface region, a release material overlying the surface region, an n-type gallium and nitrogen containing material; an active region overlying the n-type gallium and nitrogen containing material, a p-type gallium and nitrogen containing material; and a first transparent conductive oxide material overlying the p-type gallium and nitrogen containing material, and an interface region overlying the conductive oxide material. The method includes bonding the interface region to a handle substrate and subjecting the release material to an energy source to initiate release of the gallium and nitrogen containing substrate member. The method includes forming a cavity member comprising a waveguide structure, a first end, and a second end and forming the first end and second end by initiating a cleaving process in the handle substrate material. In an example, a length of the cavity member is defined by the first cleaved end and the second cleaved end. The length of the cavity member is less than about 1500 um, less than about 1000 um, less than about 600 um, less than about 400 um, or less than about 200 um.

In an example, the present invention provides a method for fabricating a laser diode device. The method includes providing a gallium and nitrogen containing substrate member comprising a surface region, the surface region characterized by a nonpolar or semipolar orientation; a release material overlying the surface region, an n-type gallium and nitrogen containing material; an active region overlying the n-type gallium and nitrogen containing material, a p-type gallium and nitrogen containing material; and an interface region overlying the p-type gallium and nitrogen containing material. The method includes bonding the interface region to a handle substrate; subjecting the release material to an energy source to initiate release of the gallium and nitrogen containing substrate member and forming a cavity member comprising a waveguide structure, a first end, and a second end. The method includes forming the first end and second end by initiating a cleaving process in the handle substrate material.

In an example, the present invention provides a method for fabricating a laser diode device. The method includes providing a gallium and nitrogen containing substrate member comprising a surface region. The method includes forming a patterned dielectric material overlying the surface region to expose a portion of the surface region within a vicinity of an recessed region of the patterned dielectric material and maintaining an upper portion of the patterned dielectric material overlying covered portions of the surface region. The method also includes performing a lateral epitaxial growth overlying the exposed portion of the surface region to fill the recessed region overlying the exposed portion and causing a thickness of the lateral epitaxial growth to be formed overlying the upper portion of the patterned dielectric material. The method includes forming an n-type gallium and nitrogen containing material overlying the dielectric material, forming an active region overlying the n-type gallium and nitrogen containing material, forming a p-type gallium and nitrogen containing material, and forming a waveguide structure in the p-type gallium and nitrogen containing material. The method also includes forming a transparent conductive oxide material overlying an exposed portion of the p-type gallium and nitrogen containing material such that active region is configured between the transparent dielectric material and the conductive oxide material to cause an optical guiding effect within the active region.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 1d illustrates a GaN substrate is removed via one of several possible processes including PEC etching, laser ablation, CMP, etc. For some of these processes, a sacrificial layer may be necessary in an example. After substrate removal, a thin GaN epi-membrane will be left on top of the ITO and carrier wafer. Some p-side processing prior to bonding may be necessary depending on the final desired LD structure. The bonded epitaxially grown material will be thin <5 um. The laser structure itself will be <1.5 um of that.

FIG. 3a is an example schematic cross section of laser waveguide with double conductive oxide cladding showing ridge formation in n-type gallium and nitrogen containing material such as GaN in an example.

FIG. 3b is an example schematic cross section of laser waveguide with double conductive oxide cladding showing ridge formation in p-type gallium and nitrogen containing material such as GaN.

FIG. 3c is an example schematic cross section of laser waveguide with double conductive oxide cladding showing ridge formation in n-type and in p-type gallium and nitrogen containing material such as GaN.

FIG. 3d is an example schematic cross section of laser waveguide with conductive oxide and oxide or dielectric cladding showing ridge formation in p-type gallium and nitrogen containing material such as GaN.

FIG. 5 is an example 2D simulation for a double ITO cladding, single side ridge blue laser structure. The GaN waveguiding/cladding layer is changed from 800 nm on either side of the MQW active region to 100 nm on either side of the MQW active region. By applying a thin cavity design, confinement factor in the active region can be improved significantly.

FIG. 6a shows schematic diagrams of direct versus indirect wafer bonding to the handle wafer. In the indirect bonding approach a layer such as a metal is used between the handle wafer and the gallium and nitrogen containing epitaxial structure.

FIG. 6b is an example illustrating a preferred cleaved facet plane aligned to the preferred cleavage plane of the handling wafer, scribing and cleaving the handling wafer will assist the cleaving of the GaN laser facet. In this example m-plane GaN lasers wafer bonded to InP. Preferred cleaved facet plane must be aligned to the preferred cleavage plane of the handling wafer.

FIG. 9a is an example of SiO2 hard mask patterned and etched to expose areas for growth initiation.

FIG. 9b is example of a first step n-GaN template growth.

FIG. 9c is an example of a second step n-GaN template growth where growth conditions are altered such that sidewall growth is preferential over planar growth. This is often called lateral epitaxial overgrowth (LEO).

FIG. 9d is an example of a LD structure including MQW active region, EBL, and pGaN are grown on top of the initiation and lateral overgrowth areas.

FIG. 9h is an example of an LEO process using an air-gap.

FIG. 12 is an example illustrating die expansion.

DESCRIPTION OF THE SPECIFIC EXAMPLES

Figure 1A:
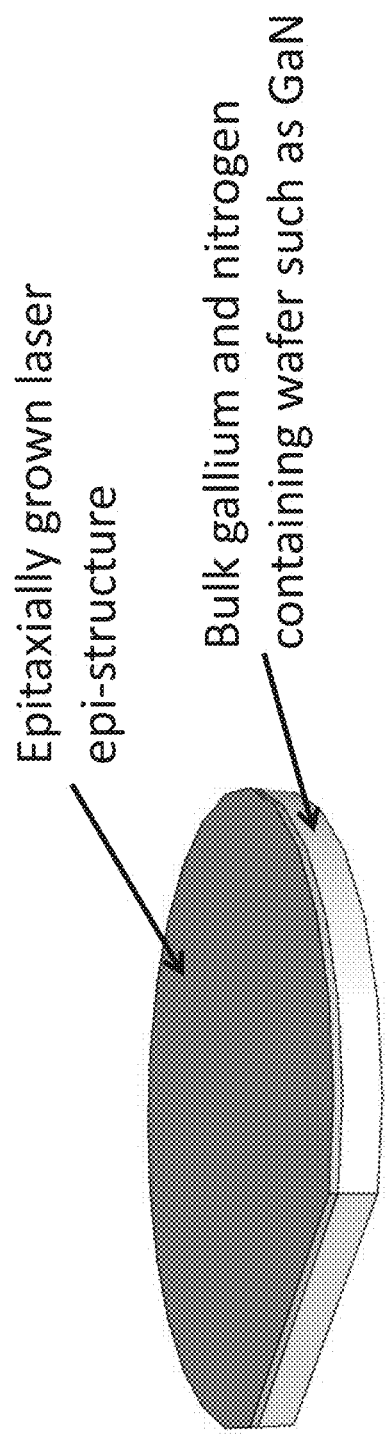
FIG. 1a illustrates an epitaxial structure including sacrificial release layer, n-type gallium and nitrogen containing material, and active region and p-type gallium and nitrogen containing material is grown on bulk gallium and nitrogen containing substrate in an example.
Figure 1B:
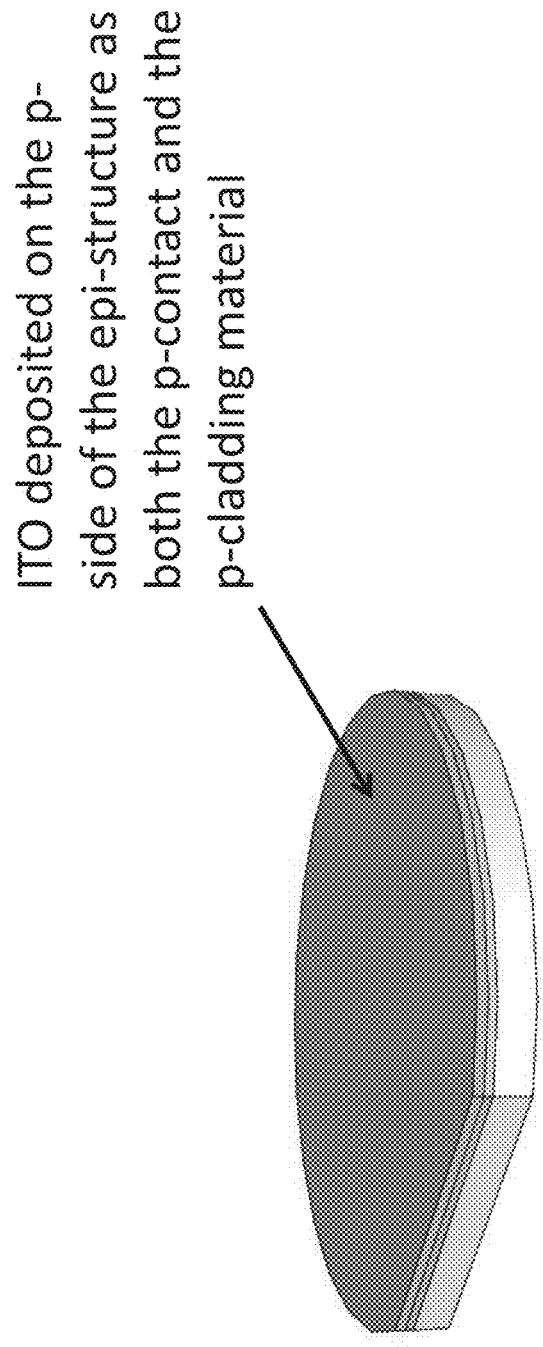
FIG. 1b illustrates a transparent conductive oxide such as ITO is deposited on the p-side (epi-surface) of the wafer in an example. Optionally, a metal contact layer could be deposited on the ITO.
Figure 1C:
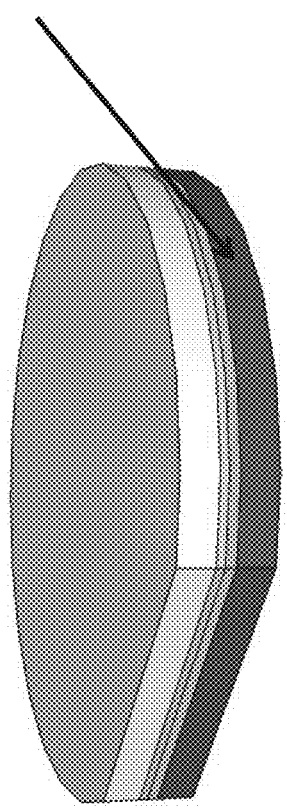
FIG. 1c illustrates an ITO+epi-structure+GaN substrate is then bonded to a handle (carrier wafer) which could be InP, GaAs, silicon, or other. Indirect bonding or direct bonding could be used for this step in an example.
Figure 1D:
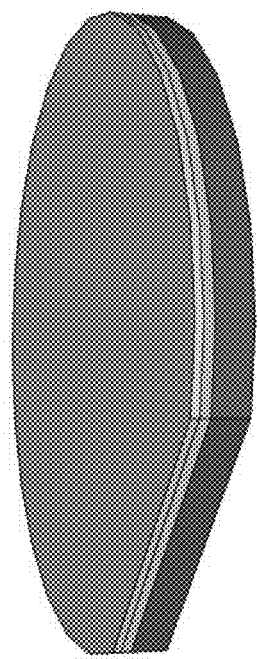

The present disclosure relates generally to optical techniques. More specifically, the present disclosure provides methods and devices using nonpolar, semi-polar, or polar c-plane oriented gallium and nitrogen containing substrates for optical applications. In an example, the present disclosure describes the fabrication of a thin ultra-high confinement factor ridge laser cavity composed of a low index upper and lower oxide cladding layers. Here, we describe multiple methods to fabricate this device:
1. Using lateral epitaxial overgrowth where a low index masking material is used as the lower n-cladding material. TCO is deposited on the p-side as the p-cladding material.
2. Using flip-chip substrate removal and ex-situ deposited TCO as both the p- and n-cladding.

In an example, the present disclosure describes a method for fabrication an ridge LD cavity with an extremely high confinement factor implementing ex-situ deposited oxide lower and upper cladding layers. The method described uses of lateral epitaxial overgrowth. In an example, the device uses a patterned oxide mask deposited on a bare GaN substrate. In an example, the substrate may be a semipolar or nonpolar growth orientation of GaN. In an example, the oxide patterned substrate is placed into a MOCVD and or MBE reactor for device growth. In an example, the initial GaN template is grown in two steps: first step is a growth initiation layer where planar growth parallel to the substrate normal is promoted; and second step is an overgrowth step where sidewall growth, parallel to the substrate surface is promoted. In an example, the sidewall growth rate is much faster than the planar growth rate. After sufficient sidewall growth, growth conditions are altered again for planar growth of the LD structure. In an example, conventional ridge laser process can be carried out on top of the winged region or on top of the unmasked window region. The transparent conductive oxide is used as the top-side p-contact because of its low index. In an example, SiO2/(or air, if SiO2 is wet etched away) is used as a lower cladding layer. In an example, LEO also provides a method for reducing MD density and MD run length.

In an example, lateral epitaxial overgrowth (LEO) is a growth technique first developed in the GaAs and Si community to reduce the density of extended defects in the epitaxial structure. It was later employed in the GaN community in order to reduce the high density of TDs and other extended defects resulting from growth on foreign substrates such as sapphire and SiC. The technique involves masking regions of the substrate with a material that does not allow epitaxial growth of GaN. Common materials are SiO2, TiN, SiN, etc. Epitaxial growth will occur in the unmasked regions. When the epitaxial growth in the unmasked region surfaces above the masked region, sidewall growth will occur. If the growth conditions are optimized, sidewall growth may be preferential over planar growth. This results in "window" regions and "wing" regions. Window regions refer to the original unmasked area, where defects from the substrate and/or substrate/epi-layer interface can extend into the epitaxial structure. Wing regions, refer to the overgrowth area where defects can be reduced several orders of magnitude in comparison to the "window" regions.

This patent describes a method to incorporate LEO growth on bulk nonpolar/semipolar substrates to fabricate an ultra-high confinement factor ridge laser cavity. The laser may be fabricated via different processing steps. FIG. 1(a)-1(h) describes two of the variations.

The process starts with a bare substrate on which SiO2 (or any other masking material that does not allow GaN growth) is patterned using conventional photolithography and/or dry/wet etching steps. Post patterning, the substrate is loaded into the epitaxial growth reactor. The growth begins with a nucleation layer inside the "window" region. After the nucleation layer achieves planar growth and surfaces above the masking material, the growth conditions in the reactor are altered such that sidewall growth is preferential over planar growth. Changes to the growth condition may include temperature, V/III ratios, total gas flow, different precursors, and doping. The sidewall growth may extend for several microns until a relatively large wing region is produced. The growth conditions are then changed again to grow the planar epitaxial laser structure.

After the epitaxial growth, convention laser ridge processing is carried out either on top of the "wing" region (variation 1) or on top of the "window" region (variation 2). In the case of variation 1, the low index masking material underneath the wing region acts as the lower cladding material. In variation 2, the partial exposure of the mode to the lower index masking material helps with lateral confinement. TCO (transparent conductive oxide)/metal contact is deposited on top of the ridge after ridge processing to form a contact as well as a low index upper cladding layer.

Another variation of this process includes wet etching away the masking material resulting in a low index air gap as the lower cladding layer as seen in FIG. 1(h).

The use of TCO as an upper cladding layer has been demonstrated by researchers at UCSB and PARC. This patent, however, includes the use of a low index masking material as the lower cladding layer. The result is a very thin, high confinement factor laser ridge cavity.

Figure 2A:
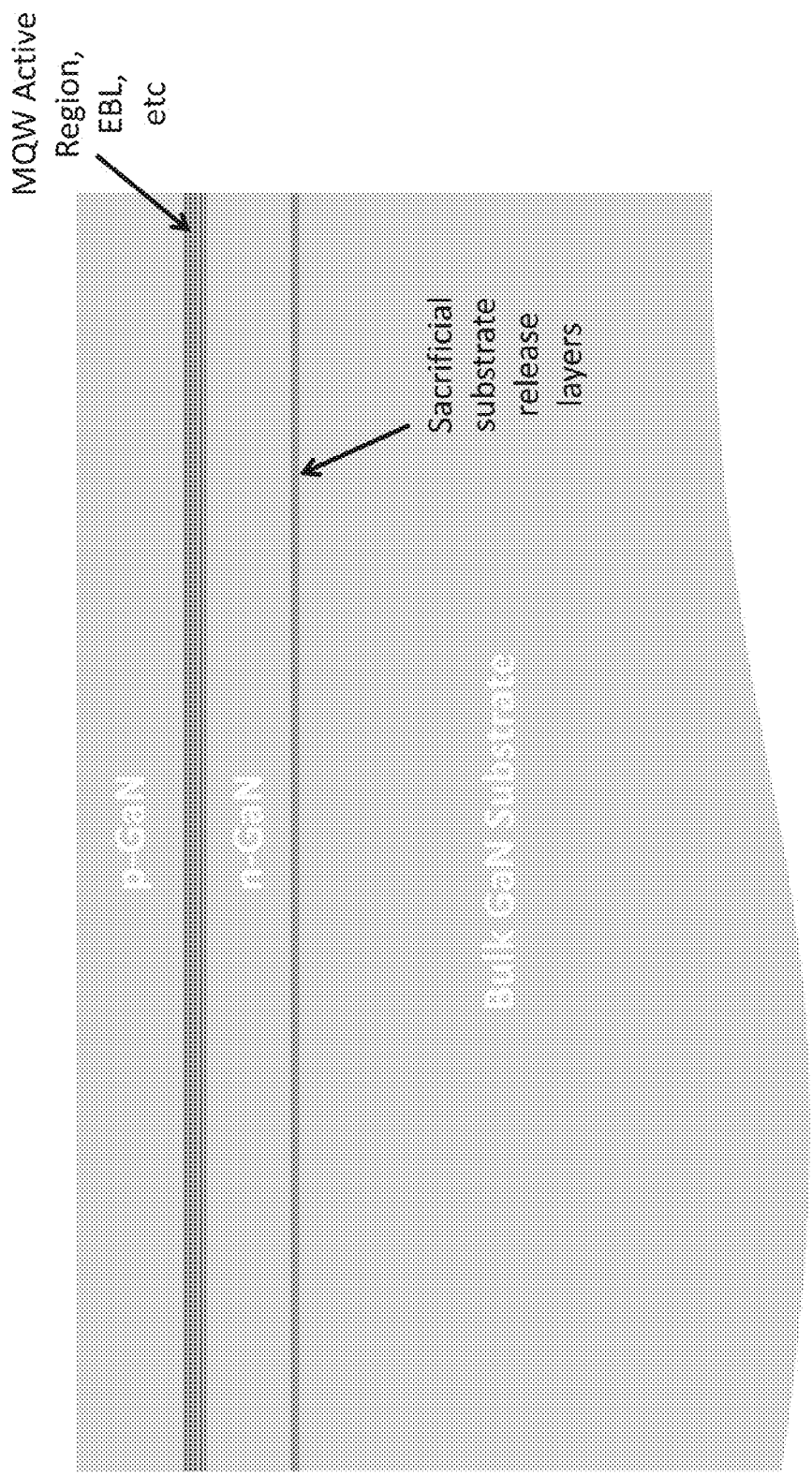
FIG. 2a is a simplified schematic of epi-structure grown on GaN substrate including a sacrificial layer in an example.
Figure 2B:
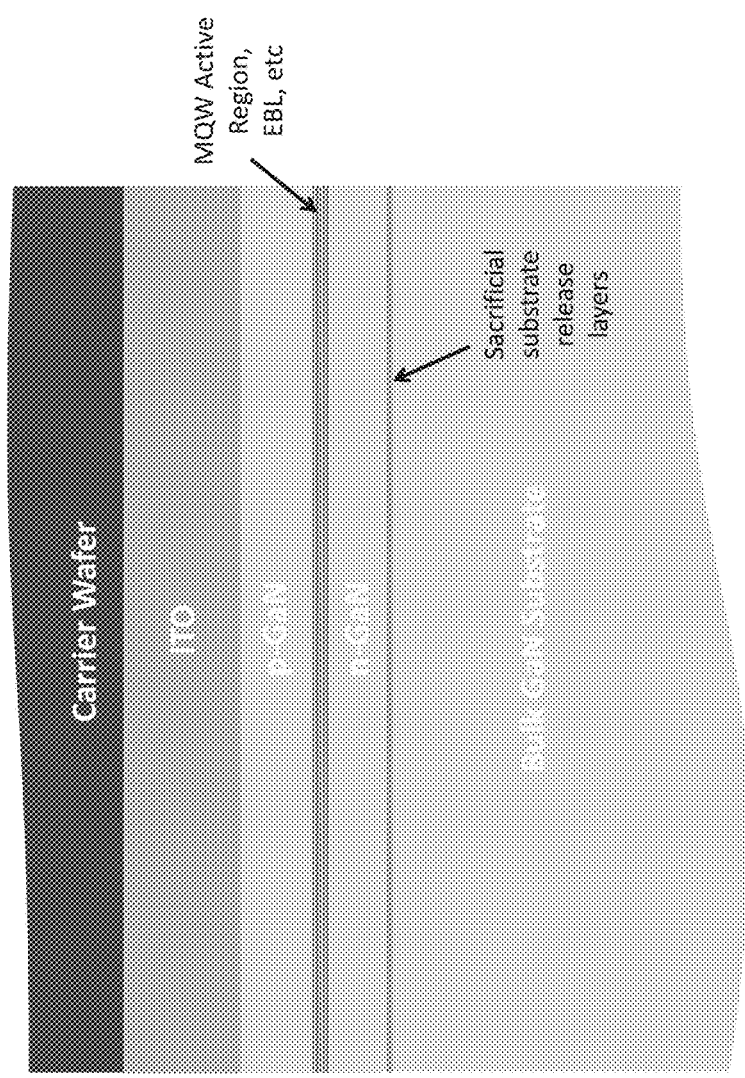
FIG. 2b is a simplified schematic of epi-structure grown on GaN substrate with a transparent conductive oxide such as ITO deposited on top of the p-type gallium and nitrogen containing material and a carrier wafer bonded to the top of the stack in an example.
Figure 2C:
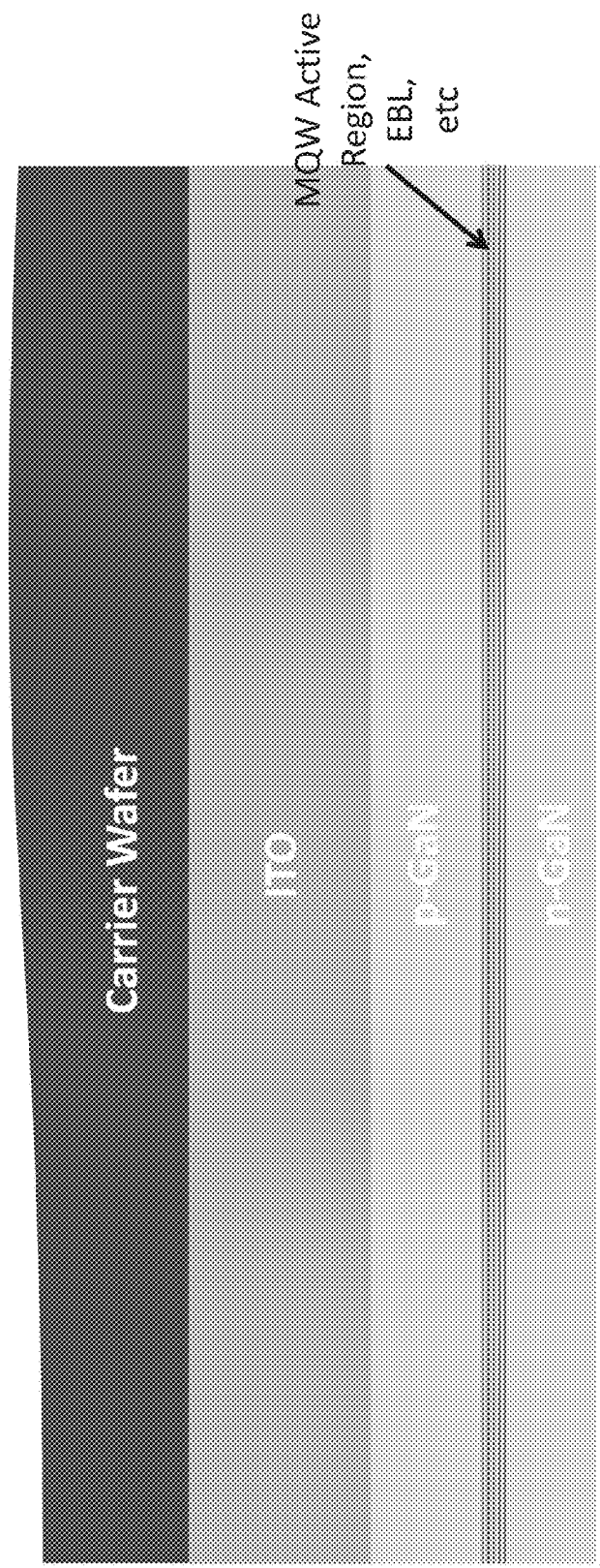
FIG. 2c is a simplified schematic of epi-structure with conductive oxide and carrier wafer after the gallium and nitrogen containing substrate has been removed in an example.
Figure 2D:
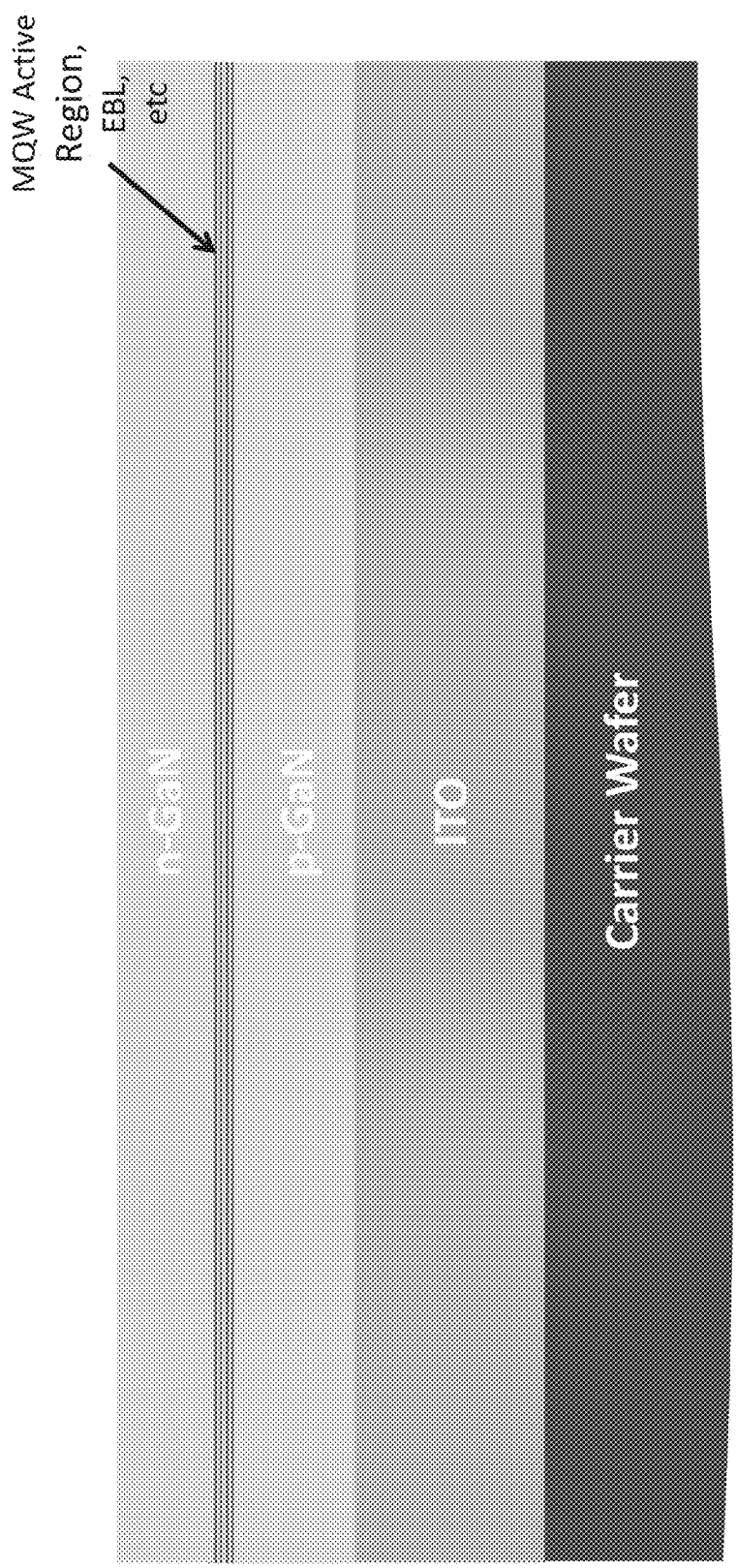
FIG. 2d is a simplified schematic of epi-structure with conductive oxide and carrier wafer after the gallium and nitrogen containing substrate has been removed in an example. The structure has been flipped over such that the carrier wafer is now the bottom of the stack.

Another advantage of this LEO method for fabrication an ultra-high confinement factor ridge laser cavity is the reduction in threading dislocation (TD) density after LEO wing growth. There is an overall reduction in TD density because the wing region should be effectively free of TDs. This results in fewer number of TDs that can bend and glide along highly strained heterointerface in the epi-structure. We believe this will be an effective method for reducing MD density and increasing the critical thickness in semipolar heteroepitaxy. This idea is schematically shown in FIGS. 2(a) and 2(b).

The most effective way of using LEO to reduce density of bending and gliding TDs while maximizing the area of useable substrate is to pattern the wafer with masking material along the in-plane projection of [0001]. This is because MD formation in semipolar heteroepitaxial growth occurs most readily by dislocation arrays oriented orthogonal to the in-plane projection of [0001]. Moreover, this allows fabrication of ridge laser cavities with stripes oriented along the in-plane projection of [0001] which has higher optical gain than ridge laser stripes oriented orthogonal to the in-plane projection of [0001]. This is shown in FIG. 3.

This high confinement of the structure may also help reduce asymmetric optical substrate anomalies with the lower masking oxide/cladding material acting as an optical blocking layer.

In an example, this method uses conventional planar growth of a LD epi-structure on either nonpolar/semipolar/polar GaN substrates. A transparent conductive oxide (TCO) is then deposited on the free epitaxial surface to form a transparent, conductive contact layer with an index of refraction lower than GaN or AlGaN films of compositions that can be grown fully strained at the thicknesses needed to provide sufficient confinement of the optical mode. Two example TCOs are indium tin oxide (ITO) and zinc oxide (ZnO). ITO is the commercial standard for TCOs, and is used in a variety of fields including displays and solar cells where a semi-transparent electrical contact is desired. ZnO offers the advantage of being a direct gap semiconductor with the same crystal structure as GaN and can be grown epitaxially on GaN at temperatures relatively low compared to growth temperatures of AlInGaN alloys. The bandgap of ZnO is also sufficiently large and similar to GaN (approx. 3.3 eV) that it will exhibit negligible band-edge absorption of visible wavelengths of light. ZnO can be deposited in a variety of ways such as metal organic chemical vapor deposition, other vapor deposition techniques, and from a solution.

The wafer is then bonded to a handle, with the free-surface of the TCO adjacent to the bonding interface. The bonding can either be direct, i.e. with the TCO in contact with the handle material, or indirect, i.e. with a bonding media disposed between the TCO and the handle material in order to improve the bonding characteristics. For example, this bonding media could be Au—Sn solder, CVD deposited SiO2, a polymer, CVD or chemically deposited polycrystalline semiconductor or metal, etc. Indirect bonding mechanisms may include thermocompression bonding, anodic bonding, glass frit bonding, bonding with an adhesive with the choice of bonding mechanism dependent on the nature of the bonding media.

Thermocompression bonding involves bonding of wafers at elevated temperatures and pressures using a bonding media disposed between the TCO and handle wafer. The bonding media may be comprised of a number of different layers, but typically contain at least one layer (the bonding layer) that is composed of a relatively ductile material with a high surface diffusion rate. In many cases this material is either Au, Al or Cu. The bonding stack may also include layers disposed between the bonding layer and the TCO or handle wafer that promote adhesion or act as diffusion barriers should the species in the TCO or handle wafer have a high solubility in the bonding layer material. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the TCO and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Metal layer stacks may be spatially non-uniform. For example, the initial layer of a bonding stack may be varied using lithography to provide alignment or fiducial marks that are visible from the backside of the transparent substrate.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Direct bonding between TCO deposited on both the GaN and handle wafers, of the TCO to the handle wafer or between the epitaxial GaN film and TCO deposited on the handle wafer would also be made at elevated temperatures and pressures. Here the bond is made by mass transport of the TCO, GaN and/or handle wafer species across the bonding interface. Due to the low ductility of TCOs the bonding surfaces must be significantly smoother than those needed in thermocompressive bonding of metals like gold.

The embodiments of this invention will typically include a ridge of some kind to provide lateral index contrast that can confine the optical mode laterally. One embodiment would have the ridge etched into the epitaxially grown GaN cladding layers. In this case, it does not matter whether the ridge is etched into the p-type GaN layer before TCO deposition and bonding or into the n-type layer after bonding and removal of the substrate. In the former case, the TCO would have to be planarized somehow to provide a surface conducive to bonding unless a reflowable or plastically deformable bonding media is used which could accommodate large variations in height on the wafer surface. In the latter case bonding could potentially be done without further modifying the TCO layer. Planarization may be required in either case should the TCO deposition technique result in a sufficiently rough TCO layer as to hinder bonding to the handle wafer.

In the case where a ridge is formed either partially or completely with the TCO, the patterned wafer could be bonded to the handle, leaving air gaps on either side of the ridge, thereby maximizing the index contrast between the ridge and surrounding materials.

After p-side ridge processing, ITO is deposited as the p-contact. Following ITO deposition, the wafer is bonded p-side down to a carrier wafer and the bulk of the substrate is removed via laser lift-off or photochemical etching (PEC). This will require some kind of sacrificial layer on the n-side of the epi-structure.

Laser ablation is a process where an above-band-gap emitting laser is used to decompose an absorbing sacrificial (Al,In,Ga)N layer by heating and inducing desorption of nitrogen. The remaining Ga sludge is then etched away using aqua regia or HCl. This technique can be used similarly to PEC etching in which a sacrificial material between the epitaxial device and the bulk substrate is etched/ablated away resulting in separation of the epitaxial structure and the substrate. The epitaxial film (already bonded to a handling wafer) can then be lapped and polished to achieve a planar surface.

PEC etching is a photoassisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

Figure 4:
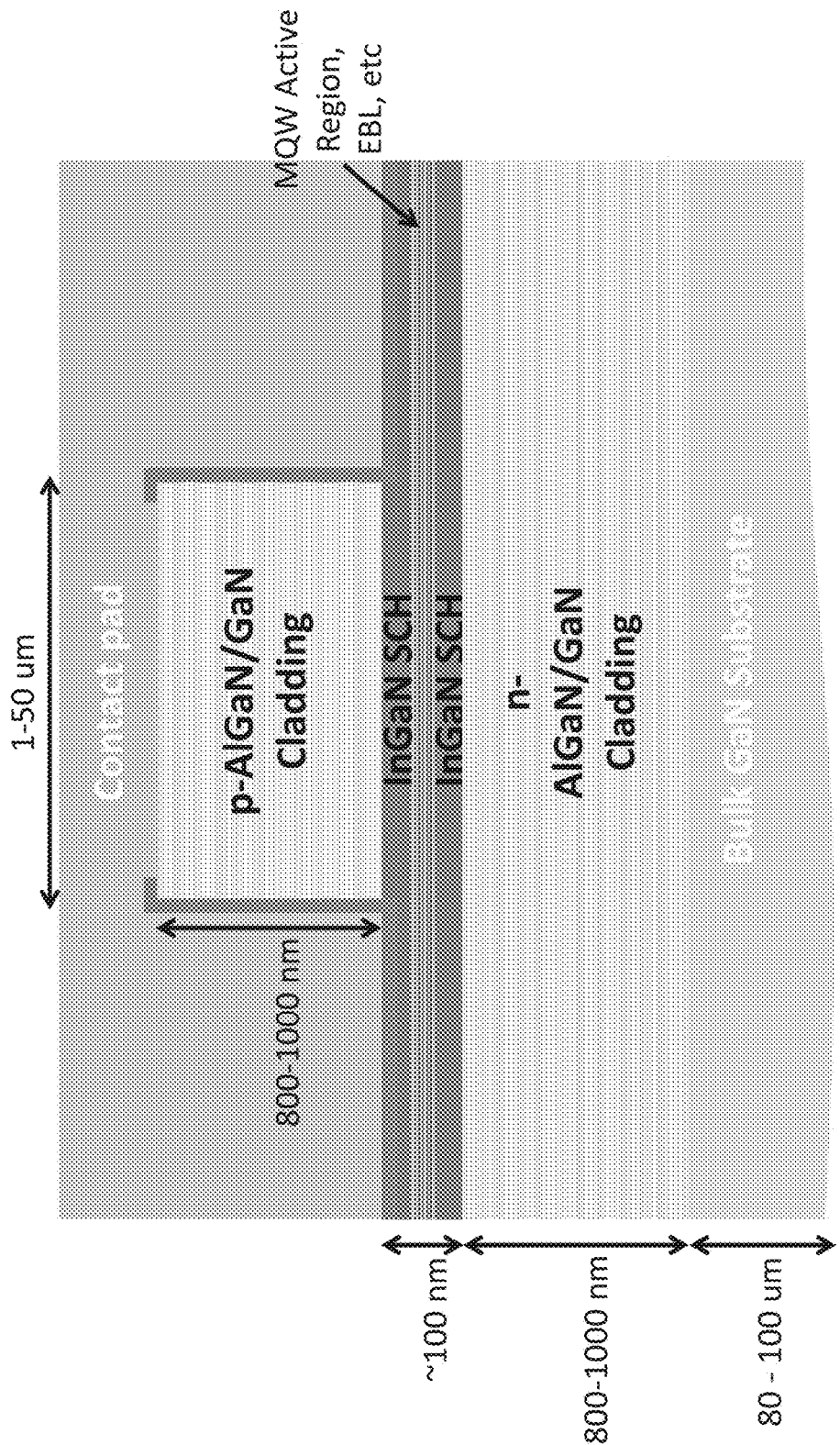
FIG. 4 is an example schematic of a conventional III-nitride laser structure with AlGaN claddings.

After laser lift-off, ITO is deposited as the n-contact. One version of this process flow using laser lift-off is described in FIGS. 4(a) and 4(b). Using this method, the substrate can be subsequently polished and reused for epitaxial growth. Sacrificial layers for laser lift-off are ones that can be included in the epitaxial structure between the light emitting layers and the substrate. These layers would have the properties of not inducing significant amounts of defects in the light emitting layers while having high optical absorption at the wavelengths used in the laser lift-off process. Some possible sacrificial layers include epitaxially grown layers that are fully strained to the substrate which are absorbing either due to bandgap, doping or point defectivity due to growth conditions, ion implanted layers where the implantation depth is well controlled and the implanted species and energy are tuned to maximize implantation damage at the sacrificial layer and patterned layers of foreign material which will act as masks for lateral epitaxial overgrowth.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the cladding material remaining after substrate removal can also be incorporated to allow better control of the etch process. The etch properties of the etch stop layer can be controlled solely by or a combination of alloy composition and doping. A potential etch stop layer would an AlGaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

PEC etching can be done before or after direct/indirect bonding of the free surface of the TCO to the handle material. In one case, the PEC etching is done after bonding of the p-side TCO to the handle material and the PEC etch releases the III-nitride epitaxial material from the GaN substrate. In another case, PEC etching of the sacrificial layer is done before bonding such that most of the sacrificial layer is removed and the III-nitride epitaxial material is held mechanically stable on the GaN substrate via small unetched regions. Such regions can be left unetched due to significant decrease in etch rates around dislocations or defects. TCO is then deposited on the epitaxial material and the TCO free surface is bonded to a handle wafer that can be composed of various materials. After bonding, mechanical force is applied to the handle wafer and GaN substrate to complete the release of III-nitride epitaxial material from the GaN substrate.

Substrate removal can also be achieved by mechanical lapping and polishing or chemical-mechanical lapping and polishing, in which case the substrate cannot be recovered. In cases where the laterally confining structure is on the bonded p-side of the wafer the substrate need only be thinned enough to facilitate good cleaving, in which case lapping and polishing may be an ideal removal technique.

Both the LEO and substrate removal method can result in very thin LD cavities with very high confinement factors. As an example, FIG. 5(a) and FIG. 5(b) show the optical mode confinement of a standard blue LD structure and one with ITO cladding layers, respectively. The waveguiding structures of the two LDs are different, but the active regions are identical. By using ITO cladding, the confinement factor is increased from 12.04% to 17.56%.

In addition to providing ultra high confinement active regions, this wafer bonding technique for the fabrication of Ga-based laser diodes can also lead to improved cleaved facet quality. Specifically, we describe a method for fabricating cleaved facets along a vertical plane for NP and SP ridge laser structures grown on bulk GaN substrates.

Achieving a high quality cleaved facet for NP and SP ridge lasers can be extremely difficult due to the nature of the atomic bonding on the crystallographic planes that are orthogonal to a laser stripe oriented in the c-direction or the projection of the c-direction. In nonpolar m-plane, the desired ridge orientation is along the c-direction. Therefore, facets must be form on a crystallographic plane orthogonal to the c-direction (the c-plane). While this can be done in practice, the yield tends to be low and the facet qualities often vary. This is in part due to the high iconicity and bond strength on the c-plane, which make cleaving difficult. In some SP orientations, it is possible to achieve vertical cleavage planes that are orthogonal to the ridge direction—however, yields also tend to be low. In other SP orientations, vertical cleavage planes orthogonal to the ridge direction simply do not exist. Cleaving in these SP orientations often result in facets that's are grossly angled.

In this wafer bonding process invention the epitaxial laser structure grown on top of the gallium and nitrogen containing substrate is bonded p-side down on top of a handling wafer. This can be done before/after top-side processing depending on the desired resulting LD structure. The handling wafer material and crystal orientation is selected to have easily achievable vertical cleavage planes (examples of such materials include Si, GaAs, InP, etc.). The LD wafer and the handling wafer can be crystallographically aligned such that the preferable cleavage direction of the handling wafer coincides with the desired cleavage plane of the ridge LD structure. The LD wafer and the handling wafer are then directly or indirectly bonded together. After bonding, the bulk GaN substrate can be removed via PEC etching, laser ablation, or CMP.

Since the resulting LD epitaxial film will be thin (<5 um), scribe marks should be penetrate the epi-film completely and into the bonding wafer. Forcing a clean cleave across the desired crystallographic plane should now be easy since there is limited amount of actual epi-material to break. This method may also allow fabrication of cleaved facet LDs on certain SP orientations that was previously not possible.

The handling wafer can be selected from several possibilities including, but not limited to 6H—SiC, Si, sapphire, MgAl$_2$O$_4$ spinel, MgO, ZnO, ScAlMgO$_4$, GaAsInP, TiO$_2$, Quartz, LiAlO2.

The above described method can also be extended into the process for die expansion. Typical dimensions for laser cavity widths are 1-30 µm, while wire bonding pads are ~100 µm wide. This means that if the wire bonding pad width restriction and mechanical handling considerations were eliminated from the GaN chip dimension between >3 and 100 times more laser diode die could be fabricated from a single epitaxial gallium and nitrogen containing wafer. This translates to a >3 to 100 times reduction in epitaxy and substrate costs. In certain device designs, the relatively large bonding pads are mechanically supported by the epitaxy wafer, although they make no use of the material properties of the semiconductor beyond structural support. The current invention allows a method for maximizing the number of GaN laser devices which can be fabricated from a given epitaxial area on a gallium and nitrogen containing substrate by spreading out the epitaxial material on a carrier wafer such that the wire bonding pads or other structural elements are mechanically supported by relatively inexpensive carrier wafer, while the light emitting regions remain fabricated from the necessary epitaxial material.

In an embodiment, mesas of gallium and nitrogen containing laser diode epitaxy material are fabricated in a dense array on a gallium and nitrogen containing substrate. This pattern pitch will be referred to as the 'first pitch'. Each of these mesas is a 'die'. These die are then transferred to a carrier wafer at a second pitch where the second pitch is greater than the first pitch. The second die pitch allows for easy mechanical handling and room for wire bonding pads positioned in the regions of carrier wafer in-between epitaxy mesas, enabling a greater number of laser diodes to be fabricated from a given gallium and nitrogen containing substrate and overlying epitaxy material. This is referred to as "die expansion," or other terms consistent with ordinary meaning for one of ordinary skill in the art.

Figure 11:
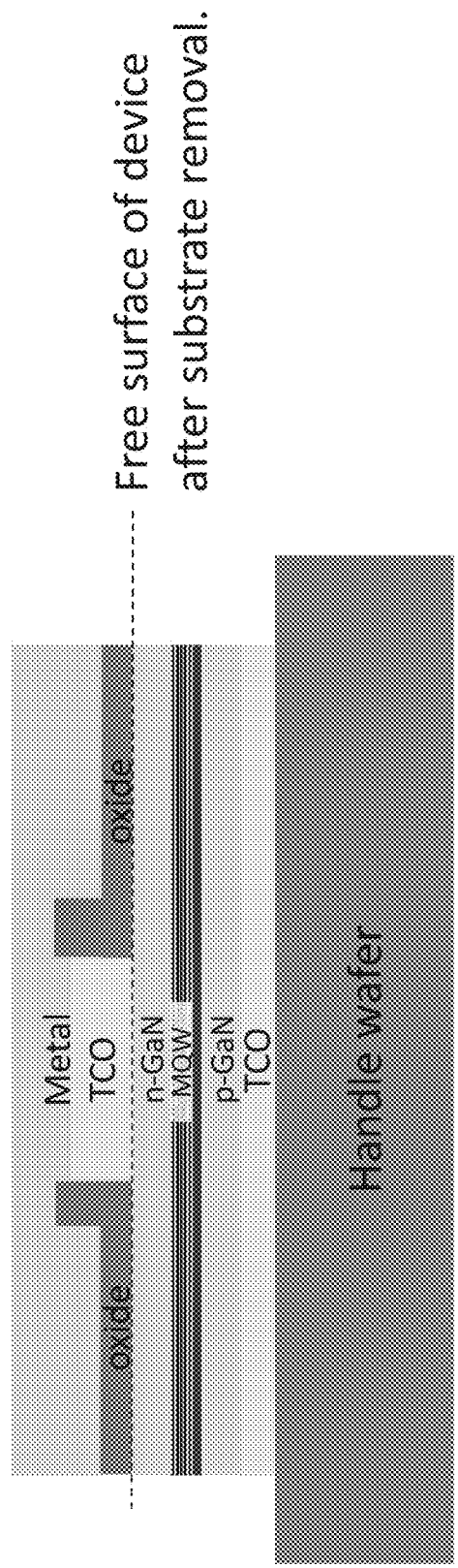
FIG. 11 is an example illustrating a ridge formed from TCO. Lateral index contrast is provided by difference in index between n-side TCO and passivating oxide. This is best where GaN cladding is thin or where n-side GaN cladding is much thinner than p-side GaN cladding.

FIG. 11—Side view illustrations of gallium and nitrogen containing epitaxial wafer 100 before the die expansion process and carrier wafer 1206 after the die expansion process. This figure demonstrates a roughly five times expansion and thus five times improvement in the number of laser diodes which can be fabricated from a single gallium and nitrogen containing substrate and overlying epitaxial material. Typical epitaxial and processing layers are included for example purposes and are n-GaN and n-side cladding layers 1201, active region 1202, p-GaN and p-side cladding 1203, insulating layers 1204, and contact/pad layers 105. Additionally, a sacrificial region 1207 and bonding material 1208 are used during the die expansion process.

In another embodiment, die expansion can be used to fabricate "ridge-less" lasers in which the epitaxial material of the entire or almost entire mesa stripe is utilized in the laser. This differs from the traditional ridge laser structure where a ridge is etched into the epitaxial material to form an index guided laser. In this embodiment for a ridge-less laser, the entire mesa is used as a gain guided laser structure. First mesas are etched and transferred onto a carrier wafer via direct/indirect bonding. The gallium and nitrogen containing substrate is removed, leaving the etched mesas on the carrier wafer at a die pitch larger than the original die pitch on the gallium and nitrogen containing carrier wafer. Dielectric material is deposited on the sidewalls of the mesa to insulate the p- and n-contacts. The dielectric material does not cover the entirety of the gallium and nitrogen containing p-contact surface. Metal or TCO is deposited on the gallium and nitrogen containing p-contact surface to form the p-contacts.

This is an exemplary process in which a ridge-less LD structure may be form through the invention described in this patent.

Figure 13:
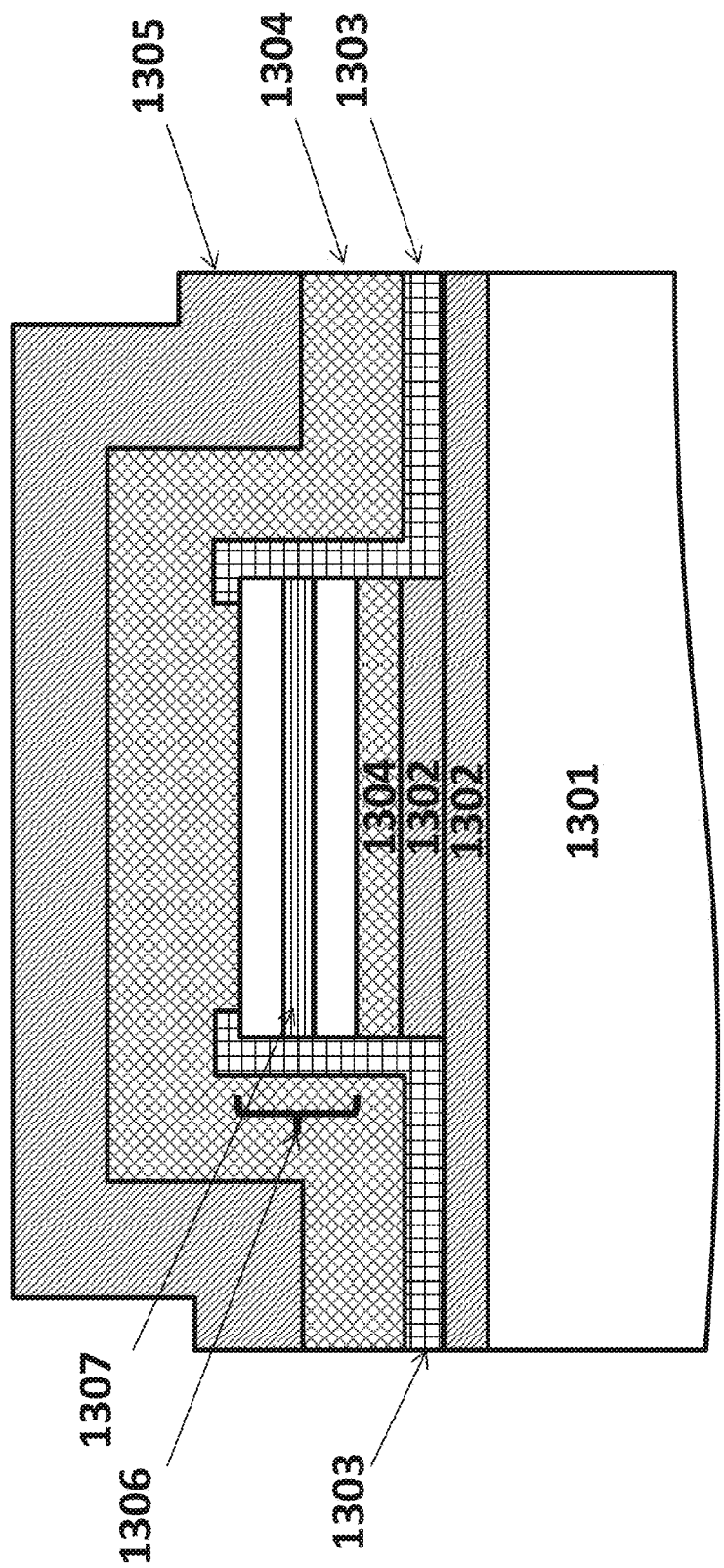
FIG. 13 is an example illustrating a ridge-less laser structure.

FIG. 13 cross-section schematic of a ridge-less laser structure fabricated using the current invention. The epitaxial material 1306 is transferred onto a carrier wafer 1301 using the techniques discussed in the current invention. Bonding of the epitaxial material 1306 to the carrier wafer 1301 can be done so via indirect metal 1302 to metal 1302 thermo-compressive bonding. The epitaxial material is cladded on the p- and n-side using TCO 1304 to provide high modal confinement in the MQW active region 1307. Insulating material 1303 is deposited on the sidewalls of the mesa to insulate the p- and n-contacts. Top-side metal pad contact 1305 is formed on top of the top side TCO 1304.

In an example, the present techniques provide for a method for fabricating a laser diode device. The method includes providing a gallium and nitrogen containing substrate member comprising a surface region, a release material overlying the surface region, an n-type gallium and nitrogen containing material; an active region overlying the n-type gallium and nitrogen containing material, a p-type gallium and nitrogen containing material; and an interface region overlying the p-type gallium and nitrogen containing material. The method includes bonding the interface region to a handle substrate; and subjecting the release material to an energy source, using at least PEC etching, to initiate release of the gallium and nitrogen containing substrate member, while maintaining attachment of the handle substrate via the interface region. The method also includes forming a contact region to either or both the n-type gallium and nitrogen containing material or the p-type gallium and nitrogen containing material.

Referring now back to FIG. 6*a*—The epitaxial LD structure and the GaN substrate may be bonded directly or indirectly to a handling wafer. Direct wafer bonding is bonding without the application of intermediate layers (i.e., GaN directly onto GaAs). Indirect wafer bonding is bonding with the application of an intermediate adhesion layer. When the adhesion layer material is comprised of a metal alloy, the process is often referred to as eutectic bonding.

FIG. 6*b*—For the cleave to translate from the bonding wafer into the thin GaN LD membrane, the two wafers must be crystallographically aligned before bonding. Here, the GaN (0001) plane (or the [11-20] direction) for an m-plane LD is aligned with InP (011) plane (or [0-11] direction).

Figure 7:
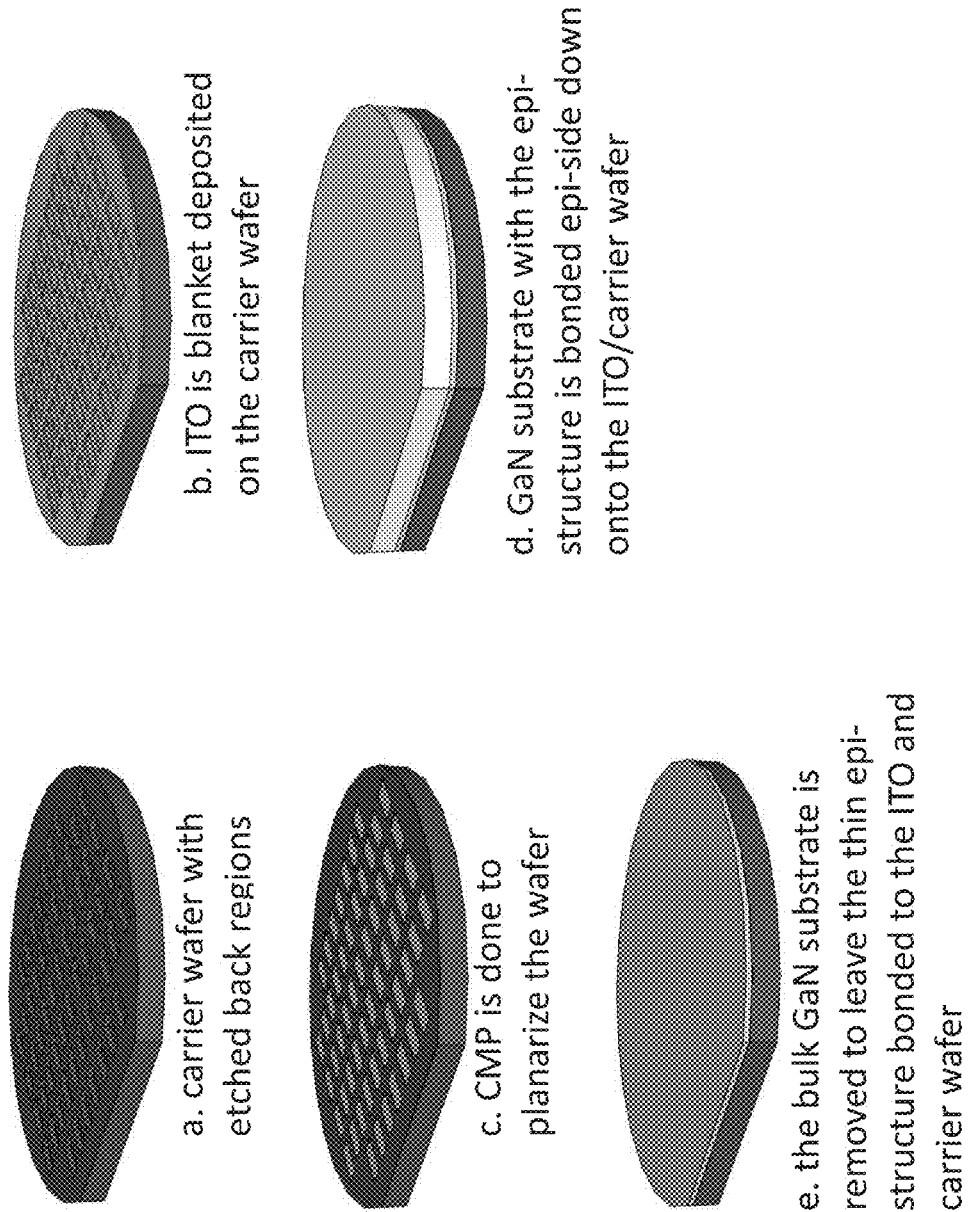
FIG. 7 is an example of a process flow that allows for direct bonding of GaN epi to a carrier wafer and ITO.
Figure 8A:
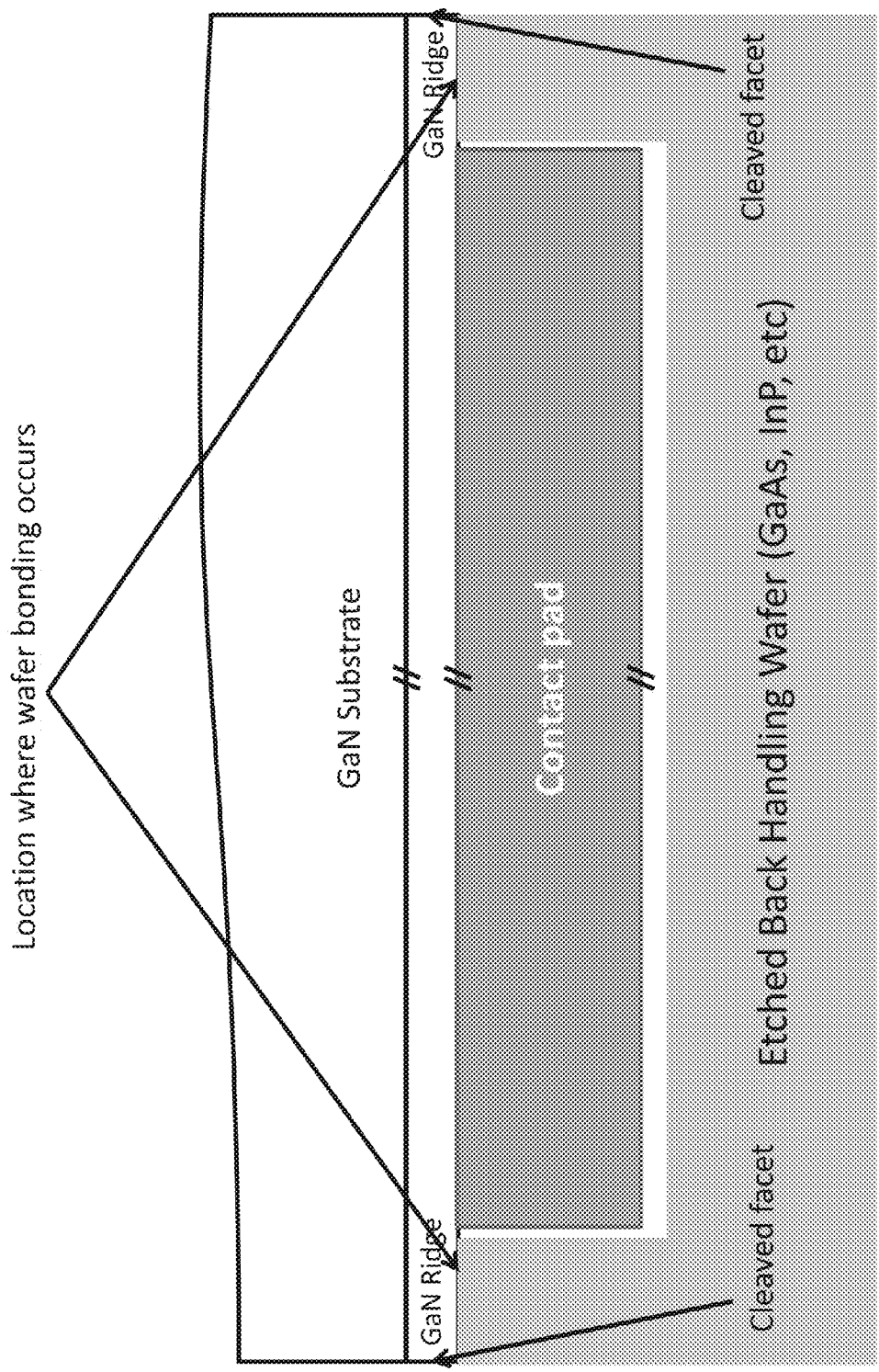
FIG. 8a is an example of a process that allows for direct/indirect bonding of GaN epi to carrier wafer after the ridge has already been formed.
Figure 8B:
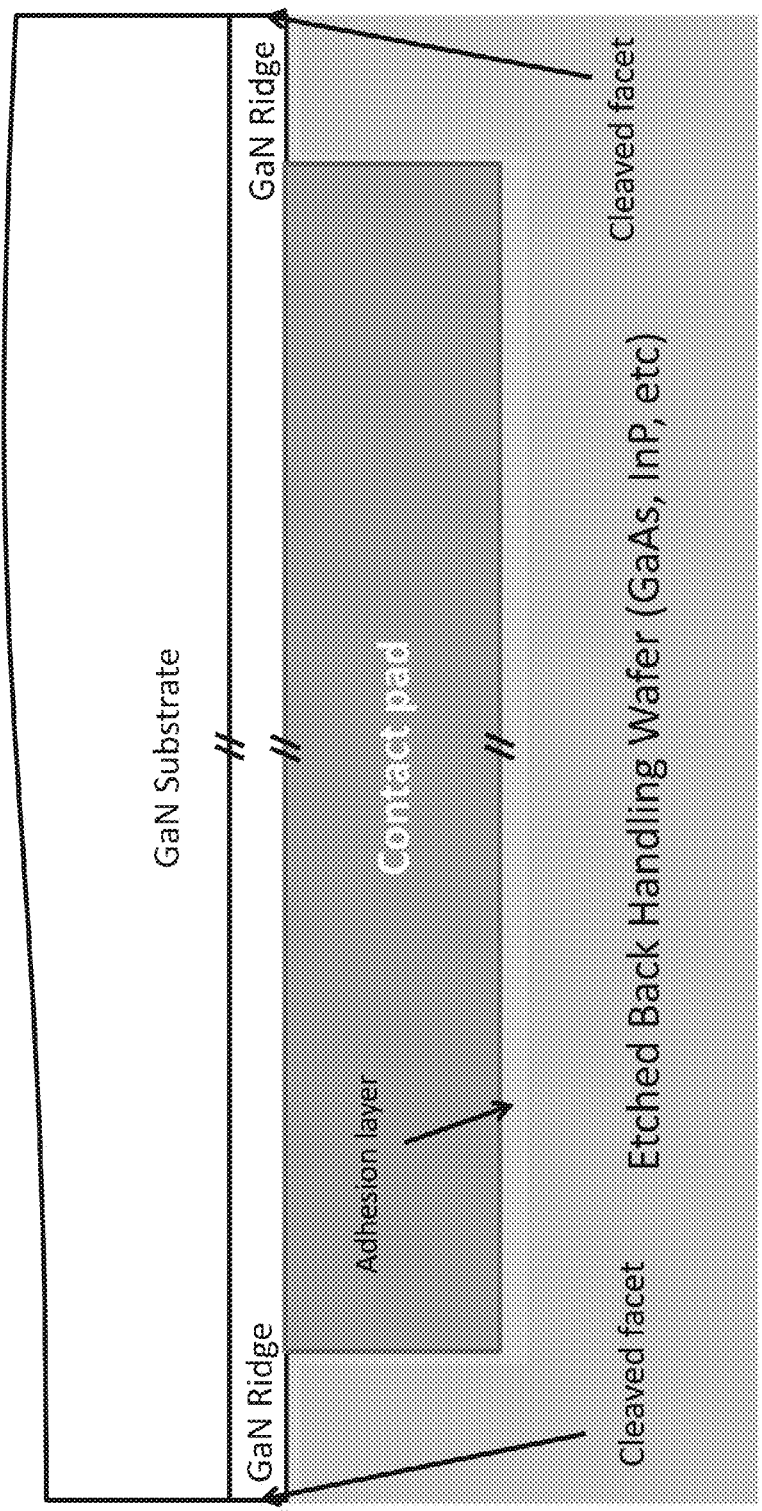
FIG. 8b is an example of a process that allows for direct/indirect bonding of GaN epi to carrier wafer after the ridge has already been formed using adhesion layer.
Figure 9E:
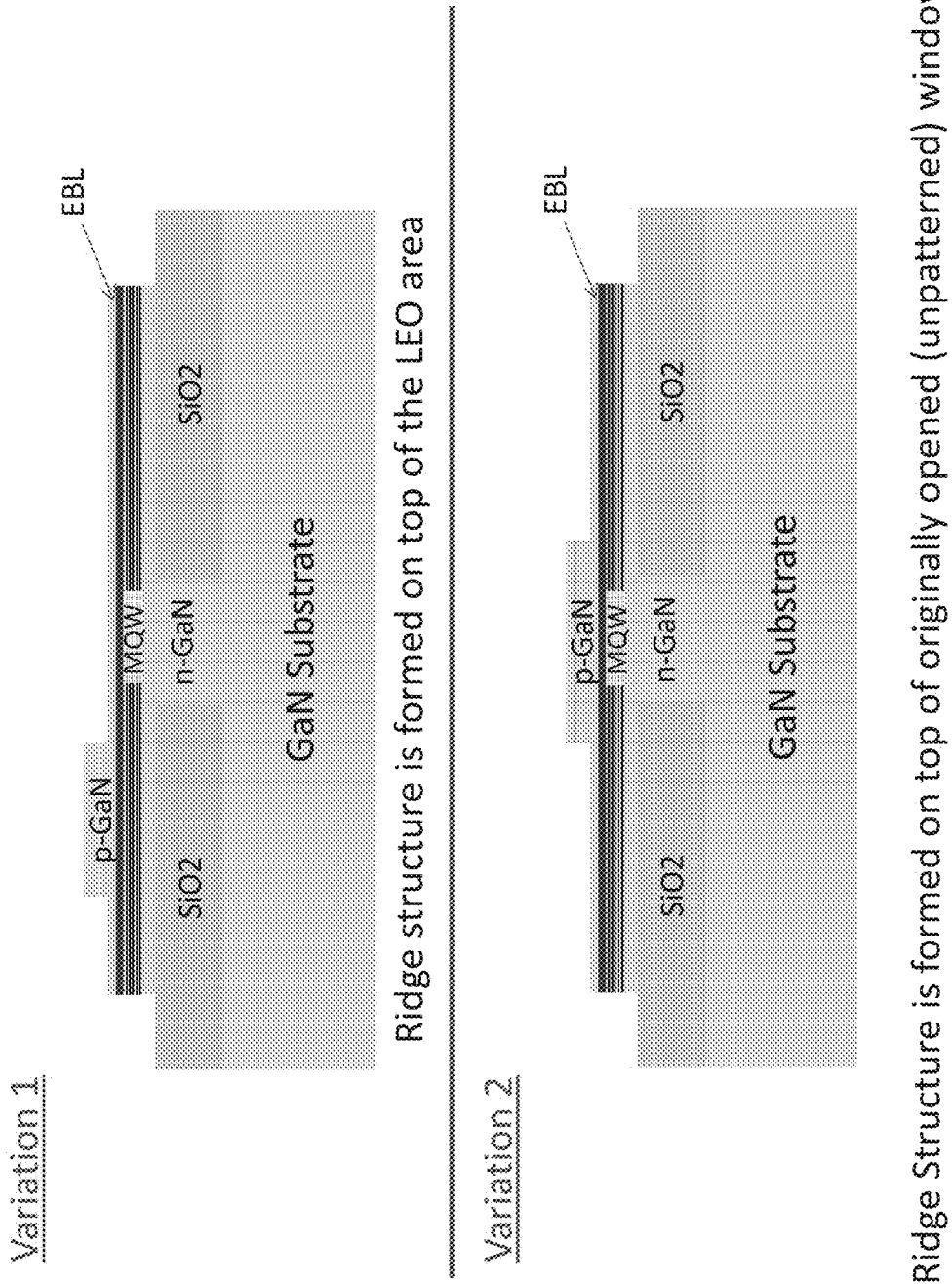
FIG. 9e is an example of an LEO process for forming a ridge waveguide.
Figure 9F:
FIG. 9f is an example of an LEO process for using deposited dielectric.
Figure 9G:
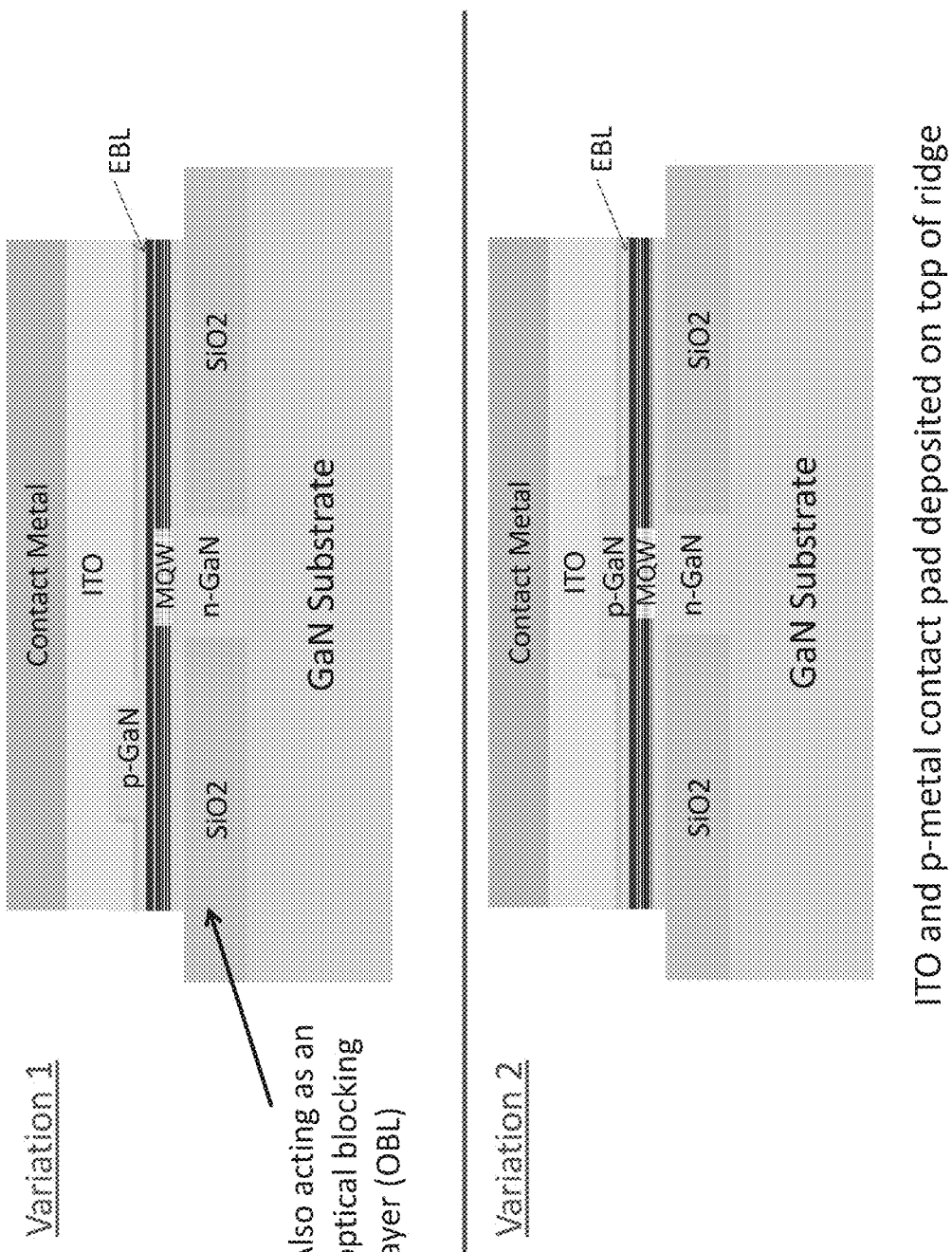
FIG. 9g is an example of an LEO process using deposited ITO and contact.
Figure 10A:
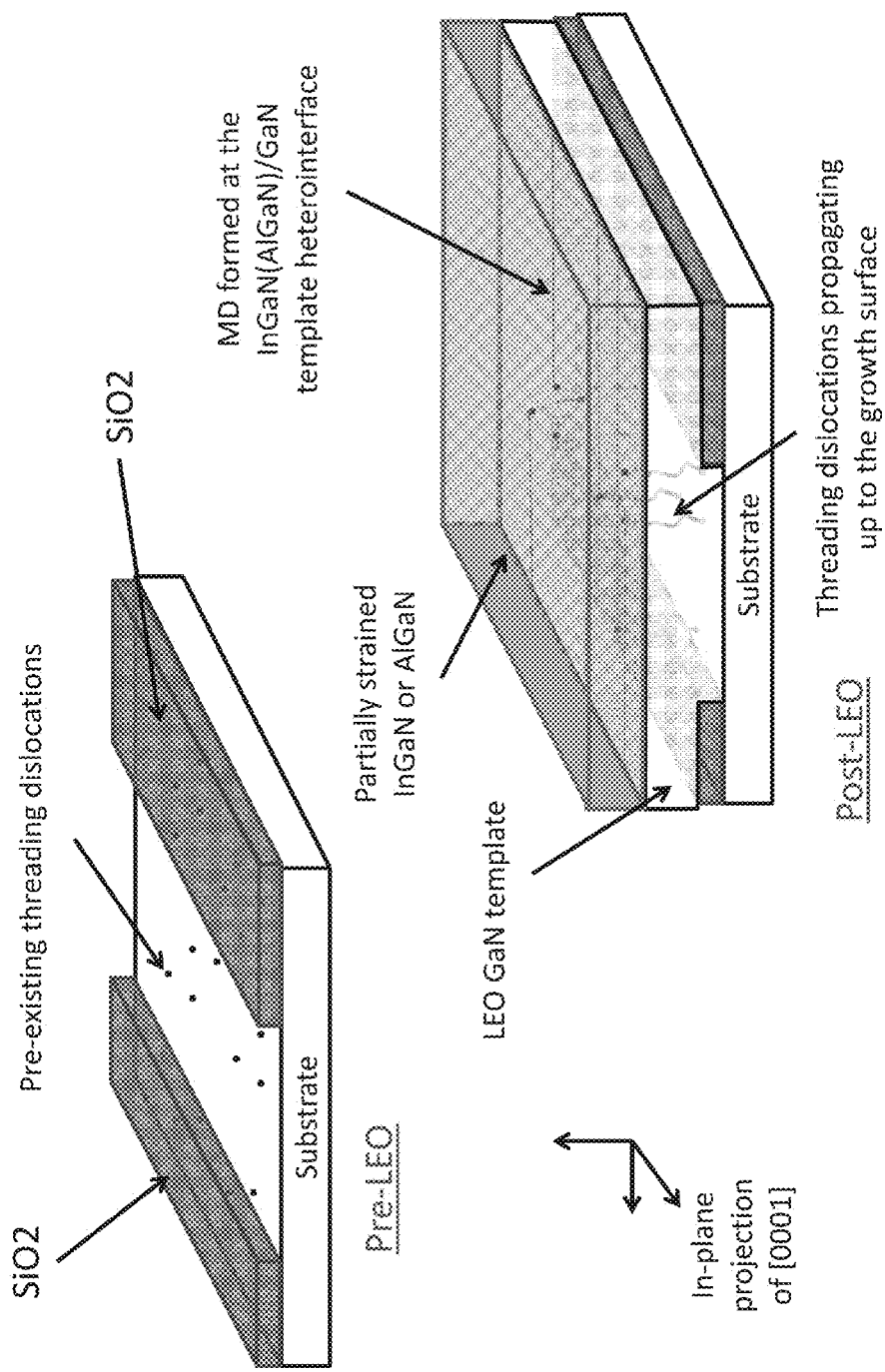
FIG. 10a is an example of patterning for defect reduction. In some semipolar orientations, such as 20-21, 20-2-1, 11-22, 10-1-1, 10-11, etc., this method will help reduce basal plane MD densities underneath the LD stripe by reducing the number of MDs allowed to form from pre-existing threading dislocations.
Figure 10B:
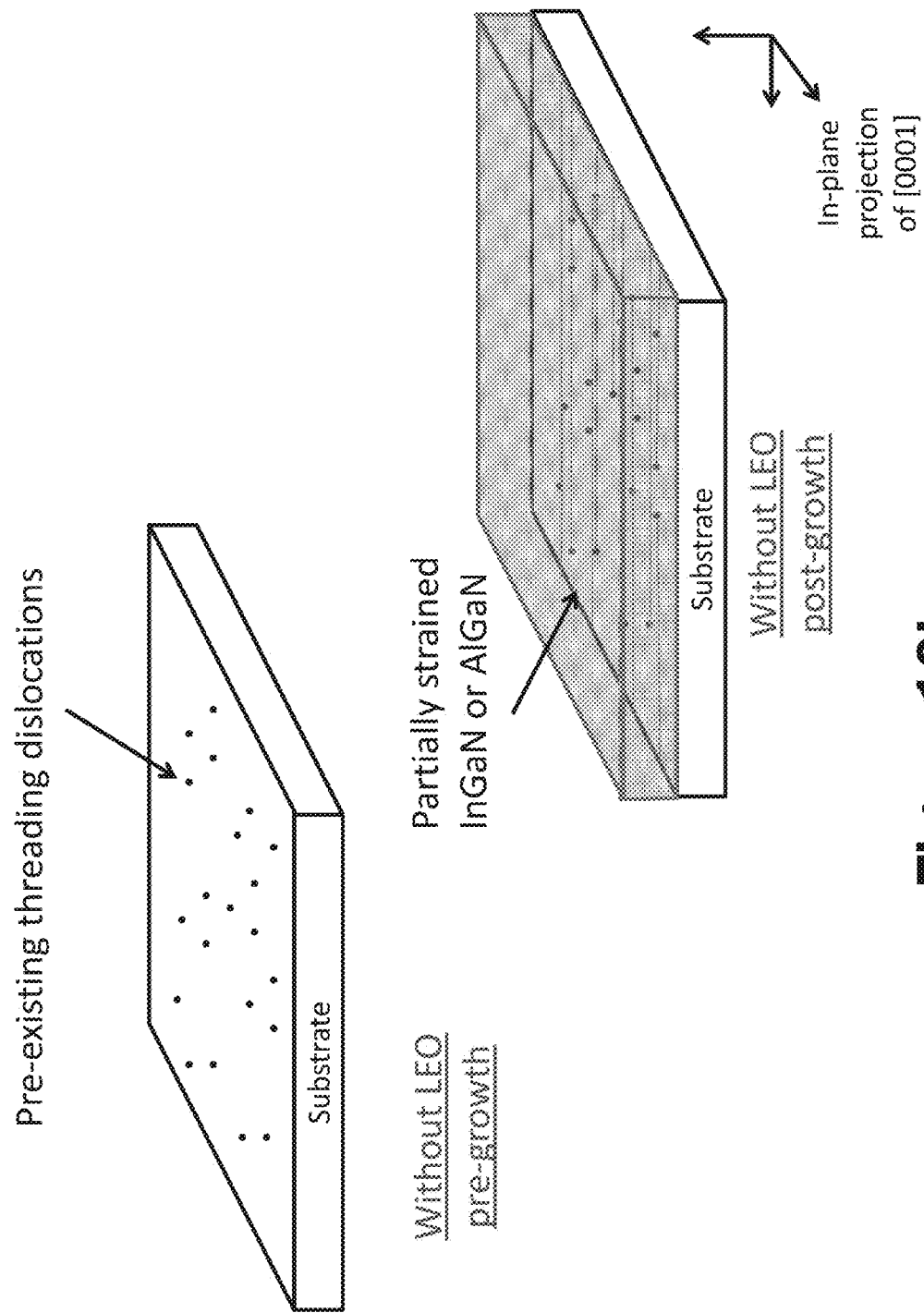
FIG. 10b is an example of patterning for defect reduction.
Figure 10C:
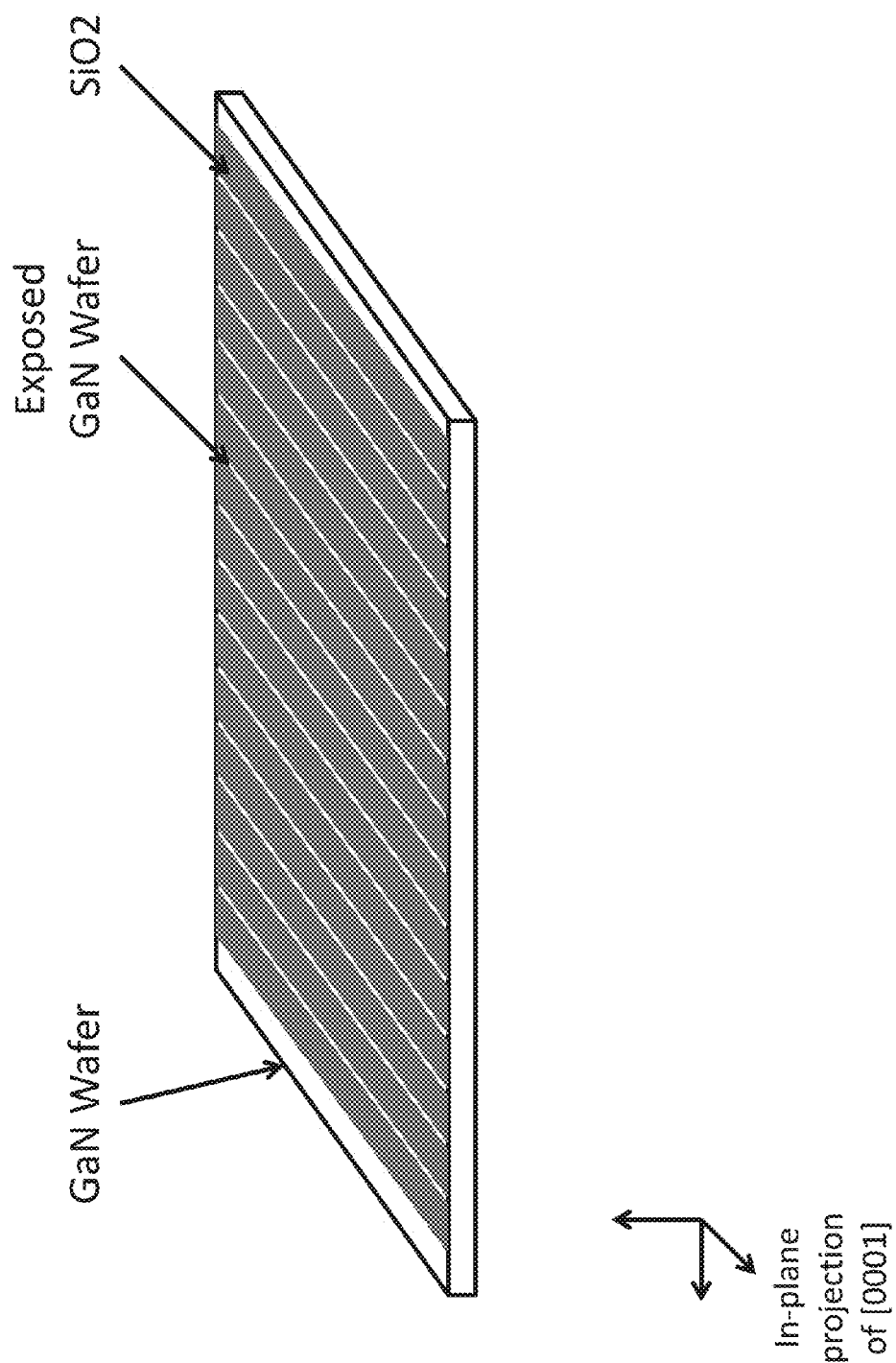
FIG. 10c is an example of Patterning for defect reduction. The substrate is patterned with $SiO_2$ in such a way that the stripes are oriented along the crystallographic direction which provides higher gain (i.e., in m-plane→c-direction, in 20-21→in-plane projection of the c-direction, etc.). Orientation of the stripes in this direction will be most effective in reducing the number of basal plane MDs since these MDs run perpendicular to the in-plane projected c-direction.

FIG. 7—Wafer bonding is sensitive to surface roughness and topography. Smooth surfaces are typically required for high yield direct wafer bonding. Direct wafer bonding of a handling wafer onto the ridge side of the LD structure would therefore likely require a pre-etched handling wafer. The pre-etched handling wafer would allow the wafer bonding to occur only on the exposed GaN ridge and not on the contact pads. This is depicted in the cross-sectional schematic in FIG. 3*a*. The use of a pre-etched handling wafer would also be applicable in the case where indirect bonding is used (FIG. 3*b*). Note, this pre-etched handling wafer is only necessary if there is exists a rough surface topography that may degrade the wafer bonding yield. A non-etched handling wafer may be used if bonding between two planar wafers is desired.

In an example, the present invention can be applied to a variety of applications, such as mobile displays, micro displays, and other devices. An example of a mobile device is known as Google Glass, which has been described in part below, See also www.wikipedia.com.

"Camera
Google Glass has the ability to take photos and record 720p HD video. While video is recording, the screen stays on.
Touchpad
A man controls Google Glass using the touchpad built into the side of the device
A touchpad is located on the side of Google Glass, allowing users to control the device by swiping through a timeline-like interface displayed on the screen. Sliding backward shows current events, such as weather, and sliding forward shows past events, such as phone calls, photos, circle updates, etc.
Technical specifications
For the developer Explorer units:
Android 4.0.4 and higher
640×360 display
5-megapixel camera, capable of 720p video recording
Wi-Fi 802.11b/g
Bluetooth
16 GB storage (12 GB available)
Texas Instruments OMAP 4430 SoC 1.2 Ghz Dual (ARMv7)
682 MB RAM "proc".
3 axis gyroscope
3 axis accelerometer
3 axis magnetometer (compass)
Ambient light sensing and proximity sensor
Bone conduction transducer."

In an example, the present laser device and module can be configured on a display of a smart phone, which includes the following features (which are found in an iPhone 4 from Apple Computer, although there can be variations), see www.apple.com.

"GSM model: UMTS/HSDPA/HSUPA (850, 900, 1900, 2100 MHz); GSM/EDGE (850, 900, 1800, 1900 MHz)
CDMA model: CDMA EV-DO Rev. A (800, 1900 MHz)
802.11b/g/n Wi-Fi (802.11n 2.4 GHz only)
Bluetooth 2.1+EDR wireless technology
Assisted GPS
Digital compass
Wi-Fi
Cellular
Retina display
3.5-inch (diagonal) widescreen Multi-Touch display
800:1 contrast ratio (typical)
500 cd/m2 max brightness (typical)
Fingerprint-resistant oleophobic coating on front and back
Support for display of multiple languages and characters simultaneously
5-megapixel iSight camera
Video recording, HD (720p) up to 30 frames per second with audio
VGA-quality photos and video at up to 30 frames per second with the front camera
Tap to focus video or still images
LED flash
Photo and video geotagging
Built-in rechargeable lithium-ion battery
Charging via USB to computer system or power adapter
Talk time: Up to 7 hours on 3G, up to 14 hours on 2G (GSM)
Standby time: Up to 300 hours
Internet use: Up to 6 hours on 3G, up to 10 hours on Wi-Fi
Video playback: Up to 10 hours
Audio playback: Up to 40 hours
Frequency response: 20 Hz to 20,000 Hz Audio formats supported: AAC (8 to 320 Kbps), Protected AAC (from iTunes Store), HE-AAC, MP3 (8 to 320 Kbps), MP3 VBR, Audible (formats 2, 3, 4, Audible Enhanced Audio, AAX, and AAX+), Apple Lossless, AIFF, and WAV User-configurable maximum volume limit Video out support at up to 720p with Apple Digital AV Adapter or Apple VGA Adapter; 576p and 480p with Apple Component AV Cable; 576i and 480i with Apple Composite AV Cable (cables sold separately)

Video formats supported: H.264 video up to 720p, 30 frames per second, Main Profile Level 3.1 with AAC-LC audio up to 160 Kbps, 48 kHz, stereo audio in .m4v, .mp4, and .mov file formats; MPEG-4 video up to 2.5 Mbps, 640 by 480 pixels, 30 frames per second, Simple Profile with AAC-LC audio up to 160 Kbps per channel, 48 kHz, stereo audio in .m4v, .mp4, and .mov file formats; Motion JPEG (M-JPEG) up to 35 Mbps, 1280 by 720 pixels, 30 frames per second, audio in ulaw, PCM stereo audio in .avi file format Three-axis gyro Accelerometer Proximity sensor Ambient light sensor."

An exemplary electronic device may be a portable electronic device, such as a media player, a cellular phone, a personal data organizer, or the like. Indeed, in such embodiments, a portable electronic device may include a combination of the functionalities of such devices. In addition, the electronic device may allow a user to connect to and communicate through the Internet or through other networks, such as local or wide area networks. For example, the portable electronic device may allow a user to access the internet and to communicate using e-mail, text messaging, instant messaging, or using other forms of electronic communication. By way of example, the electronic device may be a model of an iPod having a display screen or an iPhone available from Apple Inc.

In certain embodiments, the device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, device may be sized such that it fits relatively easily into a pocket or a hand of the user. While certain embodiments of the present invention are described with respect to a portable electronic device, it should be noted that the presently disclosed techniques may be applicable to a wide array of other, less portable, electronic devices and systems that are configured to render graphical data, such as a desktop computer.

In the presently illustrated embodiment, the exemplary device includes an enclosure or housing, a display, user input structures, and input/output connectors. The enclosure may be formed from plastic, metal, composite materials, or other suitable materials, or any combination thereof. The enclosure may protect the interior components of the electronic device from physical damage, and may also shield the interior components from electromagnetic interference (EMI).

The display may be a liquid crystal display (LCD), a light emitting diode (LED) based display, an organic light emitting diode (OLED) based display, or some other suitable display. In accordance with certain embodiments of the present invention, the display may display a user interface and various other images, such as logos, avatars, photos, album art, and the like. Additionally, in one embodiment, the display may include a touch screen through which a user may interact with the user interface. The display may also include various function and/or system indicators to provide feedback to a user, such as power status, call status, memory status, or the like. These indicators may be incorporated into the user interface displayed on the display.

In an example, the device also includes a laser module configured with a microdisplay to form a light engine. Examples of the RGB module have been described throughout the present specification. Micro-displays can be comprised of a scanning MEMS mirror, an LCOS chip, or a digital light processing chip.

According to an embodiment, the present invention provides a projection system. The projection system includes an interface for receiving video. The system also includes an image processor for processing the video. The system includes a light source including a plurality of laser diodes. The plurality of laser diodes includes a blue laser diode. The blue laser diode is fabricated on non-polar oriented gallium nitride material. The system includes a power source electrically coupled to the light source.

According to another embodiment, the present invention provides a projection system. The system includes an interface for receiving video. The system also includes an image processor for processing the video. The system includes a light source including a plurality of laser diodes. The plurality of laser diodes includes a blue laser diode. The blue laser diode is fabricated on semi-polar oriented gallium nitride material. The system also includes a power source electrically coupled to the light source.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. In this embodiment, the blue and the green laser diode would share the same substrate. The red laser could be fabricated from AlInGaP. The laser source is configured produce a laser beam by combining outputs from the blue, green, and red laser diodes. The apparatus also includes a laser driver module coupled to the laser source. The laser driver module generates three drive currents based on a pixel from the one or more frames of images. Each of the three drive currents is adapted to drive a laser diode. The apparatus also includes a MEMS scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. In this embodiment, two or more of the different color lasers would be packaged together in the same enclosure. In this copackaging embodiment, the outputs from the blue, green, and red laser diodes would be combined into a single beam. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The laser source is configured produce a laser beam by combining outputs from the blue, green, and red laser diodes. The apparatus includes a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip. Many variations of this embodiment could exist, such as an embodiment where the green and blue laser diode share the same substrate or two or more of the different color lasers could be housed in the same packaged. In this copackaging embodiment, the outputs from the blue, green, and red laser diodes would be combined into a single beam.

According to another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The apparatus includes a digital light processing chip (DLP) comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same packaged. In this copackaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof.

According to yet another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The green laser diode has a wavelength of about 490 nm to 540 nm. The laser source is configured produce a laser beam by coming outputs from the blue, green, and red laser diodes. The apparatus includes a digital light processing chip comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same packaged. In this co-packaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof. Further details can be found In U.S. Pat. No. 8,427,590, which is incorporated by reference in its entirety.

In one embodiment, one or more of the user input structures are configured to control the device, such as by controlling a mode of operation, an output level, an output type, etc. For instance, the user input structures may include a button to turn the device on or off. Further the user input structures may allow a user to interact with the user interface on the display. Embodiments of the portable electronic device may include any number of user input structures, including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

The exemplary device may also include various input and output ports to allow connection of additional devices. For example, a port may be a headphone jack that provides for the connection of headphones. Additionally, a port may have both input/output capabilities to provide for connection of a headset (e.g., a headphone and microphone combination). Embodiments of the present invention may include any number of input and/or output ports, such as headphone and headset jacks, universal serial bus (USB) ports, IEEE-1394 ports, and AC and/or DC power connectors. Further, the device may use the input and output ports to connect to and send or receive data with any other device, such as other portable electronic devices, personal computers, printers, or the like. For example, in one embodiment, the device may connect to a personal computer via an IEEE-1394 connection to send and receive data files, such as media files. Further details of the device can be found in U.S. Pat. No. 8,294,730, assigned to Apple, Inc.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Publication No. 2010/0302464, which is incorporated by reference in its entirety.

In other embodiments, the present laser device can be configured in a variety of applications. Such applications include laser displays, metrology, communications, health care and surgery, information technology, and others. As an example, the present laser device can be provided in a laser display such as those described in U.S. Publication No. 2010/0302464, which is incorporated by reference in its entirety. Additionally, the present laser device can also include elements of U.S. Provisional Application No. 61/889,955 filed on Oct. 11, 2013, which is incorporated by reference in its entirety.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention which is defined by the appended claims.

What is claimed is:

1. A method for fabricating a laser diode device comprising:

providing a gallium and nitrogen containing substrate member comprising a surface region;

forming a patterned dielectric material overlying the surface region to expose a portion of the surface region within a vicinity of an recessed region of the patterned dielectric material and maintaining an upper portion of the patterned dielectric material overlying covered portions of the surface region;

performing a lateral epitaxial growth overlying the exposed portion of the surface region to fill the recessed region overlying the exposed portion and causing a thickness of the lateral epitaxial growth to be formed overlying the upper portion of the patterned dielectric material;

forming an n-type gallium and nitrogen containing material overlying the patterned dielectric material;

forming an active region overlying the n-type gallium and nitrogen containing material;

forming a p-type gallium and nitrogen containing material;

forming a waveguide structure in the p-type gallium and nitrogen containing material; and forming a transparent conductive oxide material overlying an exposed portion of the p-type gallium and nitrogen containing material such that active region is configured between the patterned dielectric material and the transparent conductive oxide material to cause an optical guiding effect within the active region.

2. The method of claim 1, wherein the transparent conductive oxide is comprised of indium tin oxide or zinc oxide; wherein the dielectric material is comprised of silicon oxide or silicon nitride.

3. The method of claim 1, wherein surface region of the gallium and nitrogen containing substrate is configured in a semipolar, polar, or non-polar orientation; wherein the active region comprises a plurality of quantum well regions.

* * * * *